(12) United States Patent
Lee et al.

(10) Patent No.: US 11,080,130 B2
(45) Date of Patent: Aug. 3, 2021

(54) SEMICONDUCTOR DEVICES

(71) Applicant: SK hynix Inc., Icheon-si (KR)

(72) Inventors: Jae In Lee, Gwangmyeong-si (KR); Yong Mi Kim, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/731,807

(22) Filed: Dec. 31, 2019

(65) Prior Publication Data

US 2020/0379840 A1 Dec. 3, 2020

(30) Foreign Application Priority Data

May 31, 2019 (KR) .......................... 10-2019-0064549

(51) Int. Cl.
*G06F 11/07* (2006.01)
*G11C 7/10* (2006.01)

(52) U.S. Cl.
CPC ...... *G06F 11/0793* (2013.01); *G06F 11/0772* (2013.01); *G11C 7/1045* (2013.01); *G11C 7/1051* (2013.01)

(58) Field of Classification Search
CPC ............. G06F 11/0793; G06F 11/0772; G11C 7/1045; G11C 7/1051
See application file for complete search history.

(56) References Cited

U.S. PATENT DOCUMENTS

| 6,449,704 | B1* | 9/2002 | Takano | G11C 29/56 |
| | | | | 711/173 |
| 8,325,537 | B2 | 12/2012 | Shimizu et al. | |
| 8,867,288 | B2* | 10/2014 | Yoon | G11C 29/44 |
| | | | | 365/201 |
| 8,913,451 | B2* | 12/2014 | Yoon | G11C 29/40 |
| | | | | 365/201 |
| 9,165,686 | B2* | 10/2015 | Park | G11C 29/56008 |
| 9,741,455 | B1* | 8/2017 | Park | G11C 29/4401 |
| 2008/0016415 | A1* | 1/2008 | Ide | G06F 11/366 |
| | | | | 714/702 |
| 2012/0246507 | A1* | 9/2012 | Luo | G06F 11/1048 |
| | | | | 714/2 |
| 2014/0126302 | A1* | 5/2014 | Yoon | G11C 29/4401 |
| | | | | 365/189.04 |
| 2018/0052639 | A1* | 2/2018 | Woo | G06F 3/0604 |
| 2018/0052732 | A1* | 2/2018 | Jo | G06F 11/1048 |
| 2018/0102183 | A1* | 4/2018 | Shim | G11C 29/36 |
| 2018/0113755 | A1* | 4/2018 | Lim | G06F 11/0793 |
| 2019/0156909 | A1* | 5/2019 | Lee | G11C 29/72 |
| 2020/0201718 | A1* | 6/2020 | Richter | G06F 11/1469 |
| 2020/0371873 | A1* | 11/2020 | Schaefer | G11C 11/2273 |

FOREIGN PATENT DOCUMENTS

| KR | 100667784 B1 | 1/2007 |
| KR | 100786031 B1 | 12/2007 |

* cited by examiner

*Primary Examiner* — Kyle Vallecillo
(74) *Attorney, Agent, or Firm* — William Park & Associates Ltd.

(57) ABSTRACT

A semiconductor device includes an error correction circuit and a write operation control circuit. The error correction circuit generates corrected data and an error flag from read data according to whether an error is included in the read data outputted when a read operation is performed. The write operation control circuit generates a write control signal for controlling a write operation based on the error flag.

14 Claims, 21 Drawing Sheets

FIG.10

| CASE | XC<1> | XC<2> | BC<1> | BC<2> | PDEC<1:2> | PDEC<3:4> | PDEC<5:6> | PDEC<7:8> |
|---|---|---|---|---|---|---|---|---|
| 1 | H | H | H | H | H | H | H | H |
| 2 | H | L | L | L | H | L | H | L |
| 3 | L | L | H | L | H | H | L | L |

FIG.12

| CASE | PDEC<1:8> | DM<1:8> | DEC<1:8> |
|---|---|---|---|
| 4 | all 'H' | DM<1>='H'<br>DM<2>='L'<br>DM<3:8>='H' | DEC<1>='H'<br>DEC<2>='L'<br>DEC<3:8>='H' |

US 11,080,130 B2

1
SEMICONDUCTOR DEVICES

CROSS-REFERENCE TO RELATED APPLICATIONS

The present application claims priority under 35 U.S.C. 119(a) to Korean Application No. 10-2019-0064549, filed on May 31, 2019, which is incorporated herein by reference in its entirety.

BACKGROUND

1. Technical Field

Embodiments of the present disclosure relate to semiconductor devices performing a write operation using an error correction code.

2. Related Art

Recently, a DDR2 scheme or a DDR3 scheme receiving and outputting four-bit data or eight-bit data during each clock cycle time has been used to improve an operation speed of semiconductor devices. If data transmission speeds of semiconductor devices become faster, the probability of errors occurring while the data are transmitted in the semiconductor devices increases. Accordingly, advanced design schemes have been proposed to improve the reliability of the data transmission.

Whenever data are transmitted in semiconductor devices, error codes which are capable of detecting occurrence of errors may be generated and transmitted with the data to improve the reliability of data transmission. The error codes may include an error detection code (EDC) which is capable of detecting errors and an error correction code (ECC) which is capable of correcting the errors by itself.

SUMMARY

In accordance with an embodiment of the present disclosure, a semiconductor device includes an error correction circuit and a write operation control circuit. The error correction circuit is configured to generate corrected data and an error flag from read data according to whether an error is included in the read data outputted when a read operation is performed. The write operation control circuit is configured to generate a write control signal for controlling a write operation based on the error flag. The write control signal is generated based on information about pads receiving pad data and information about a burst length when no error is included in the read data.

In accordance with another embodiment of the present disclosure, a semiconductor device includes a column decoding circuit, a mask control circuit, and a write control signal generation circuit. The column decoding circuit is configured to generate a pre-decoded signal from a write strobe pulse based on an error flag, a bit change signal, and a burst change signal. The mask control circuit is configured to generate a decoded signal from the pre-decoded signal based on the error flag and a data mask signal. The write control signal generation circuit is configured to generate a write control signal from the decoded signal during a time period when a write operation is performed.

2

Figure 1:
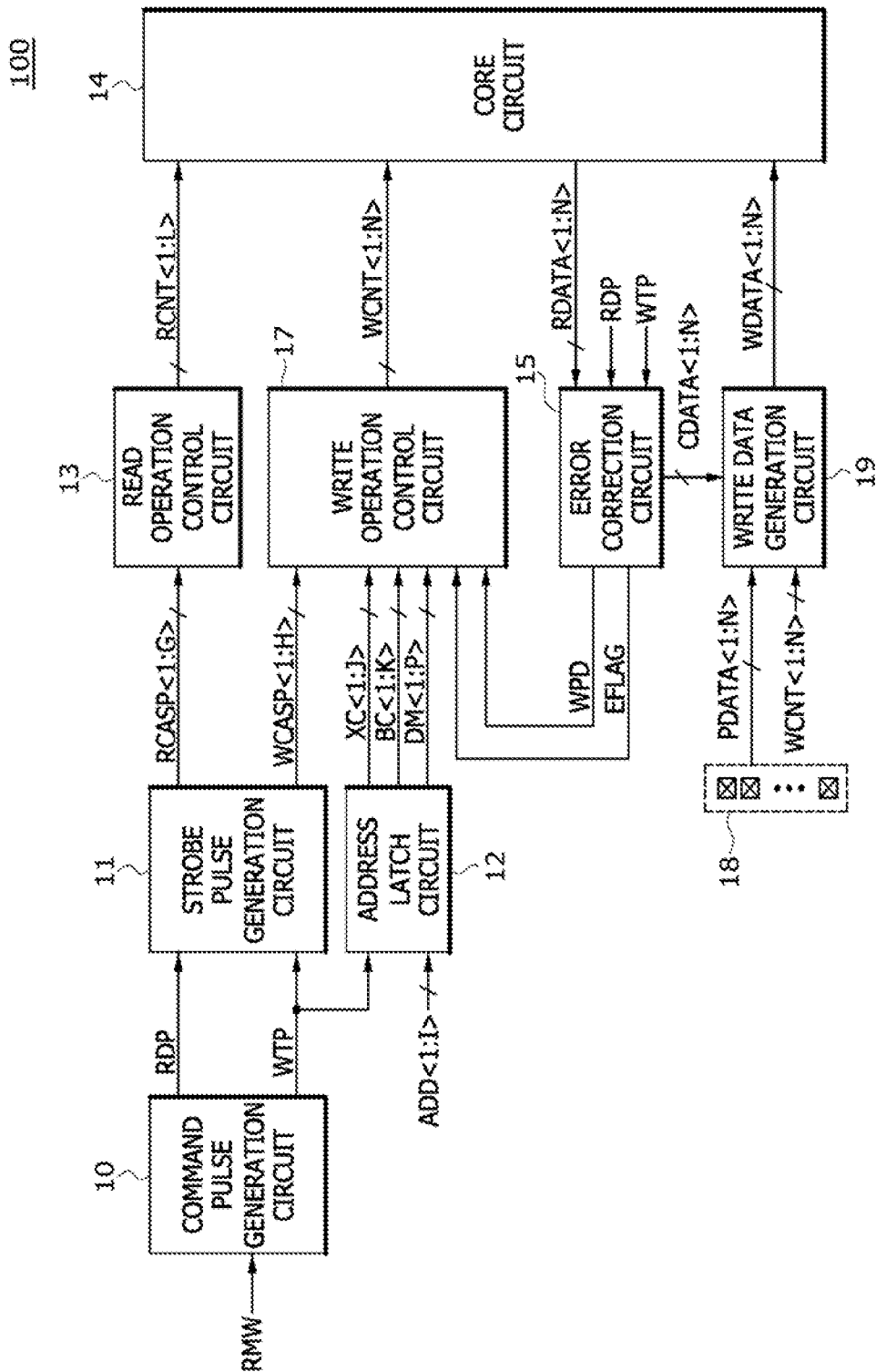
FIG. 1 is a block diagram illustrating a configuration of a semiconductor device according to an embodiment of the present disclosure.
Figure 2:
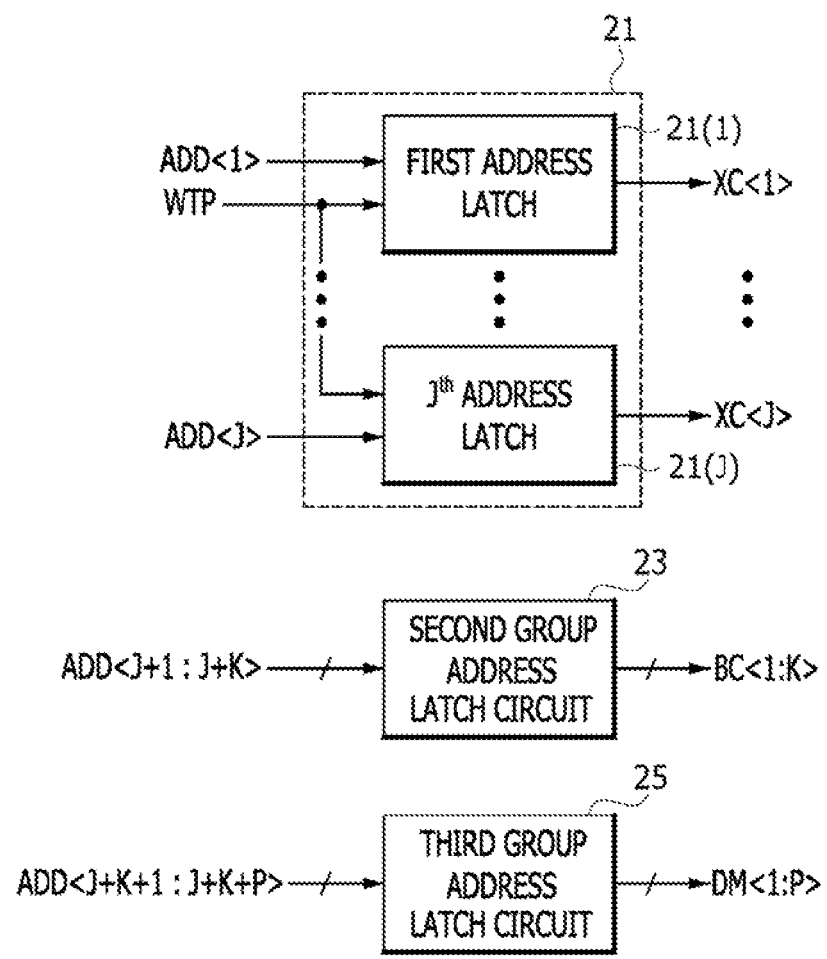

FIG. 2 is a block diagram illustrating an example of an address latch circuit included in the semiconductor device of FIG. 1.

Figure 3:
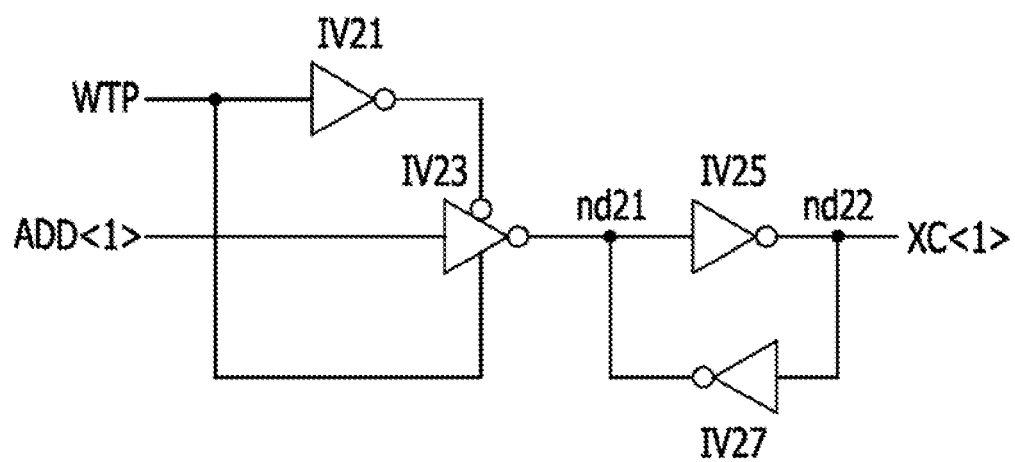

FIG. 3 is a circuit diagram illustrating an example of a first address latch included in the address latch circuit of FIG. 2.

Figure 4:
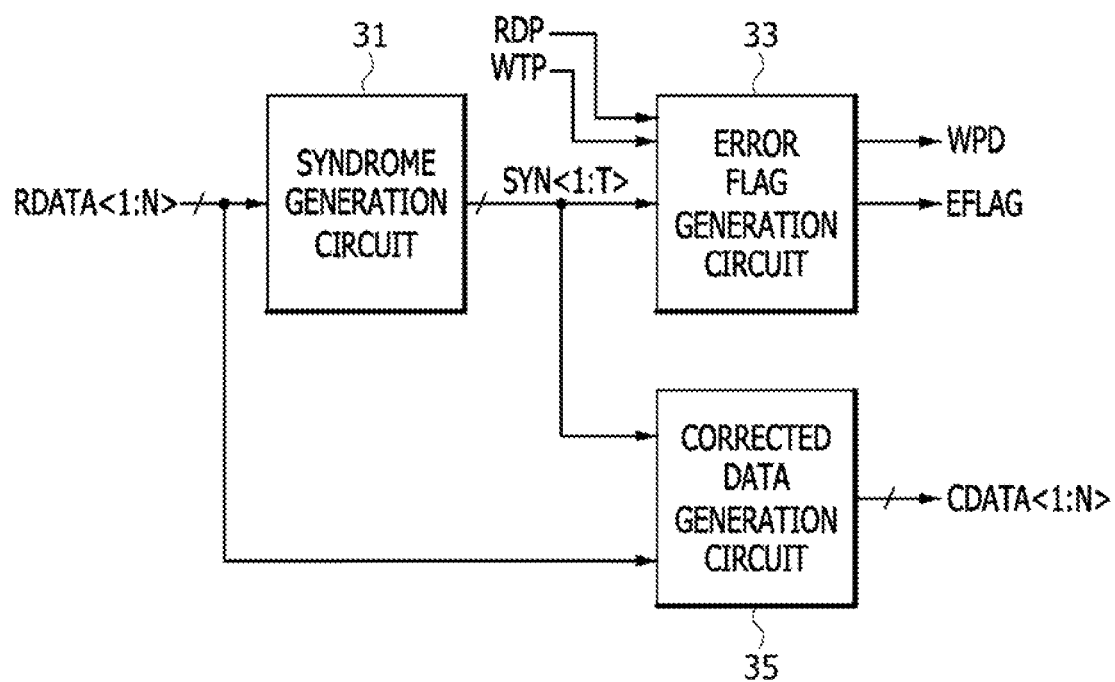

FIG. 4 is a block diagram illustrating an example of an error correction circuit included in the semiconductor device of FIG. 1.

Figure 5:
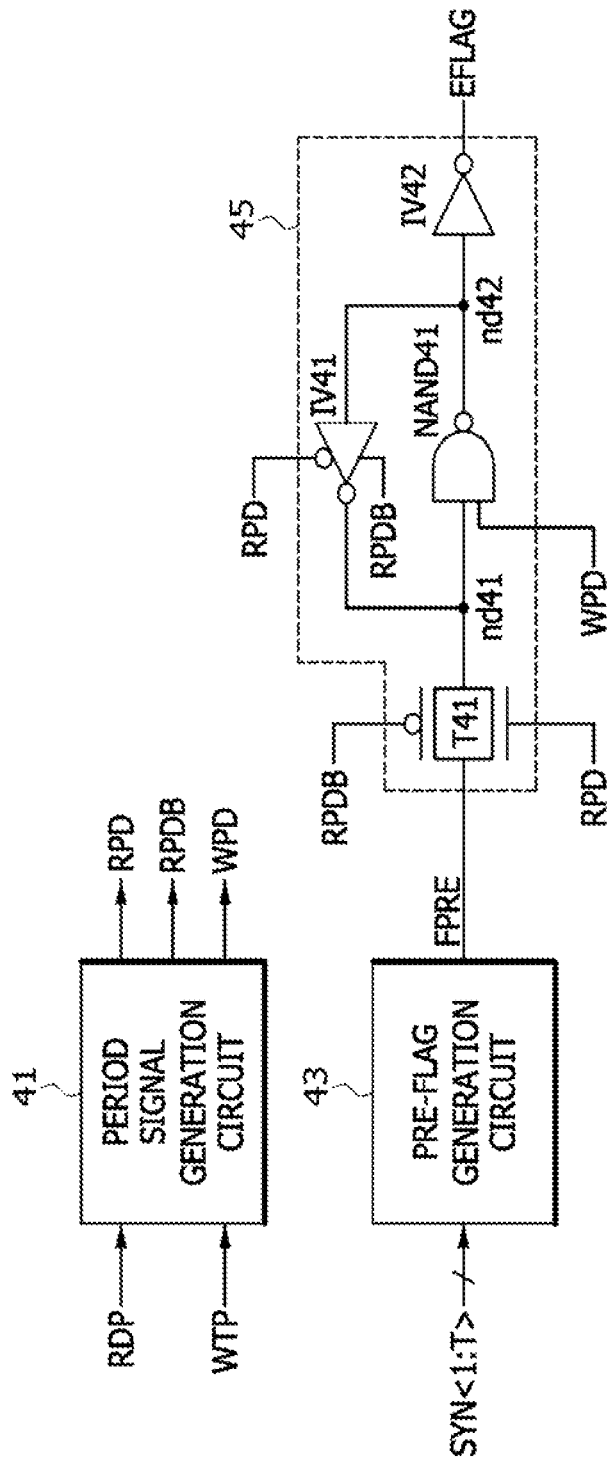

FIG. 5 illustrates an example of an error flag generation circuit included in the error correction circuit of FIG. 4.

Figure 6:
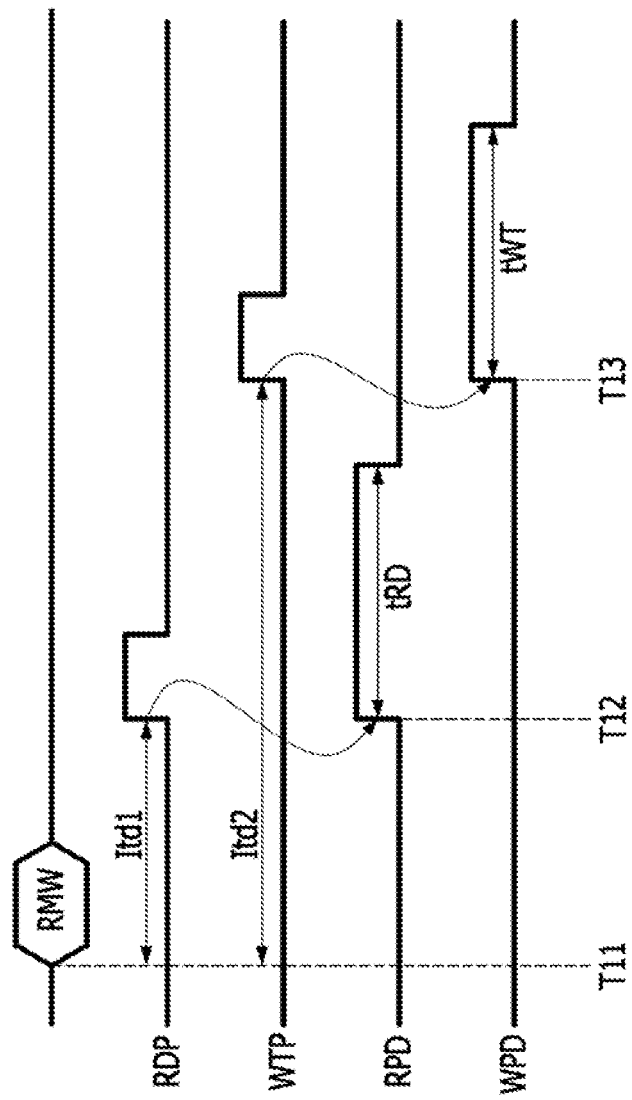

FIG. 6 is a timing diagram illustrating an operation of the error flag generation circuit shown in FIG. 5.

Figure 7:
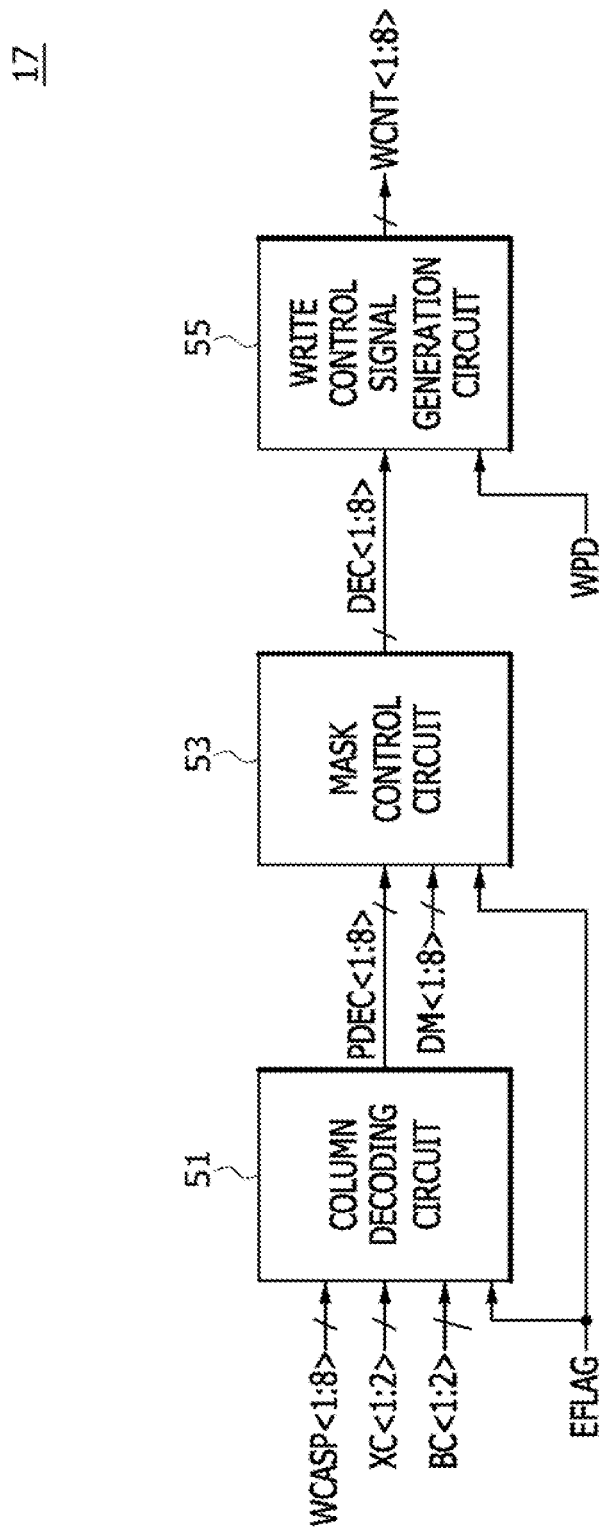

FIG. 7 is a block diagram illustrating an example of a write operation control circuit included in the semiconductor device of FIG. 1.

Figure 8:
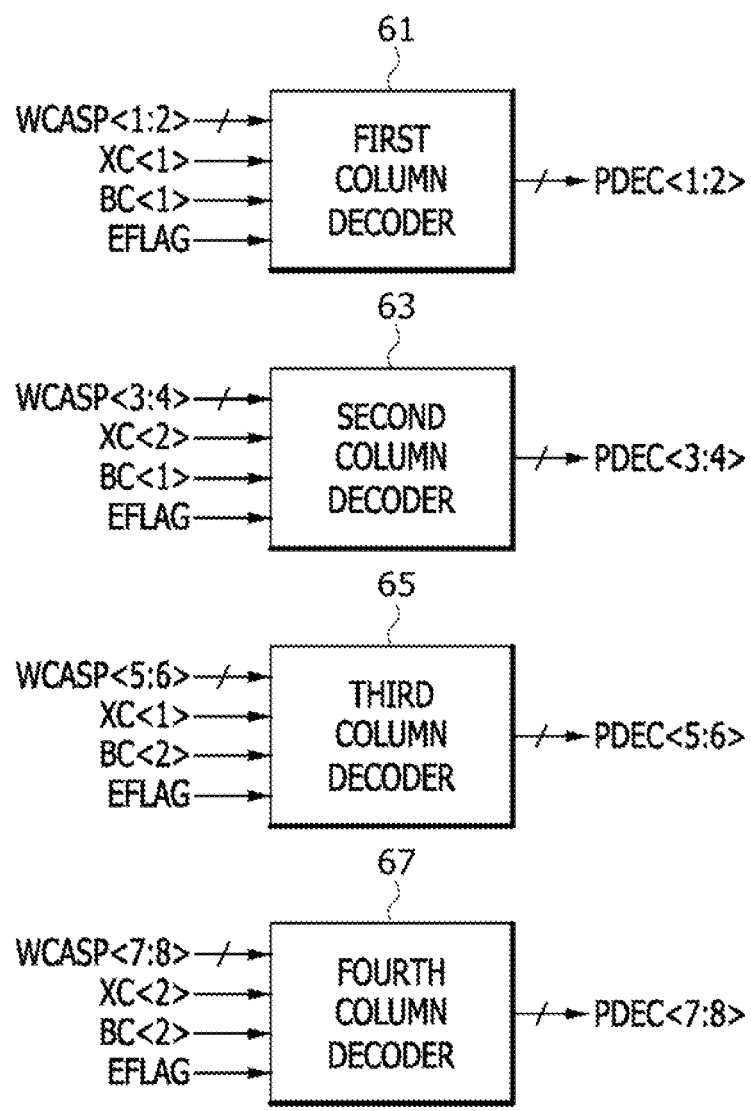

FIG. 8 is a block diagram illustrating an example of a column decoding circuit included in the write operation control circuit of FIG. 7.

Figure 9:
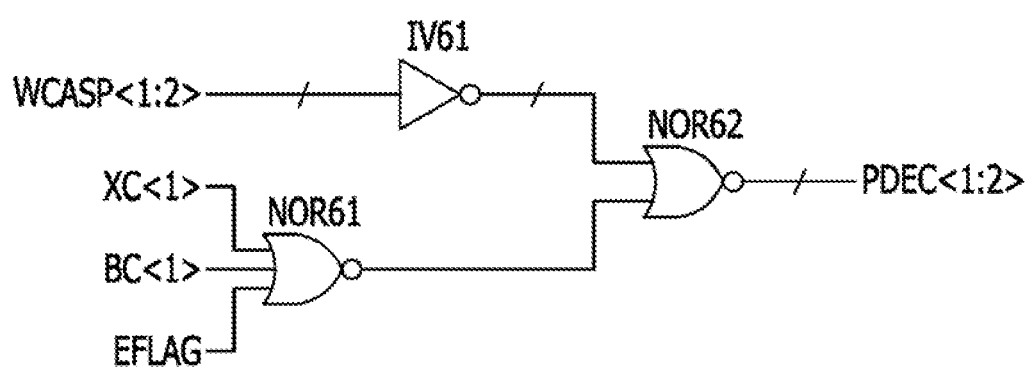

FIG. 9 is a circuit diagram illustrating an example of a first column decoder included in the column decoding circuit of FIG. 8.

FIG. 10 is a table illustrating an operation of the column decoding circuit shown in FIG. 8.

Figure 11:
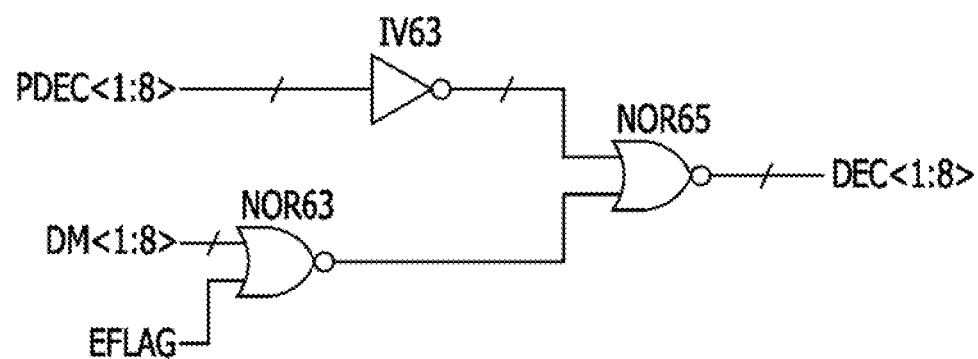

FIG. 11 is a circuit diagram illustrating an example of a mask control circuit included in the write operation control circuit of FIG. 7.

FIG. 12 is a table illustrating an operation of the mask control circuit shown in FIG. 11.

Figure 13:
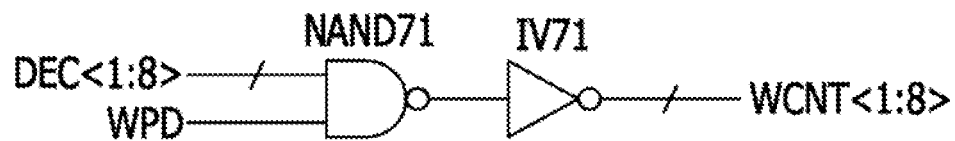

FIG. 13 is a circuit diagram illustrating an example of a write control signal generation circuit included in the write operation control circuit of FIG. 7.

Figure 14:
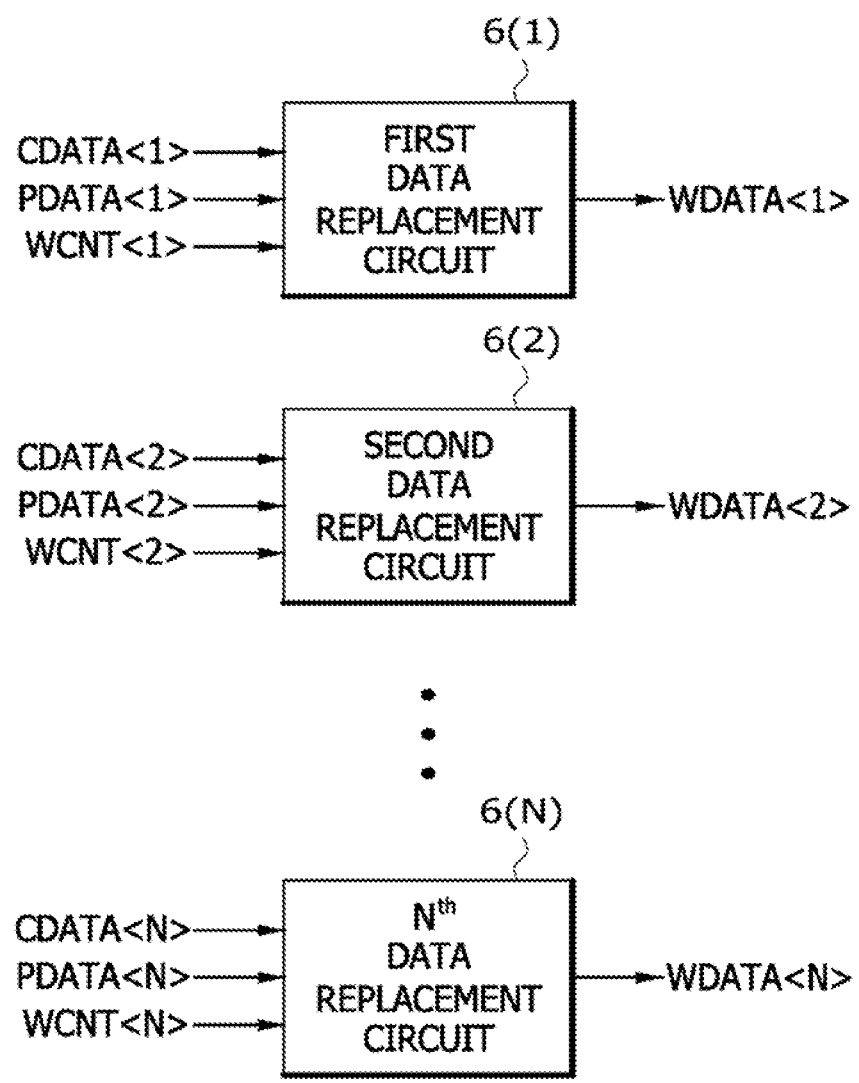

FIG. 14 is a block diagram illustrating an example of a write data generation circuit included in the semiconductor device of FIG. 1.

FIGS. 15 to 18 are schematic views illustrating write operations performed in a core circuit included in the semiconductor device of FIG. 1.

Figure 19:
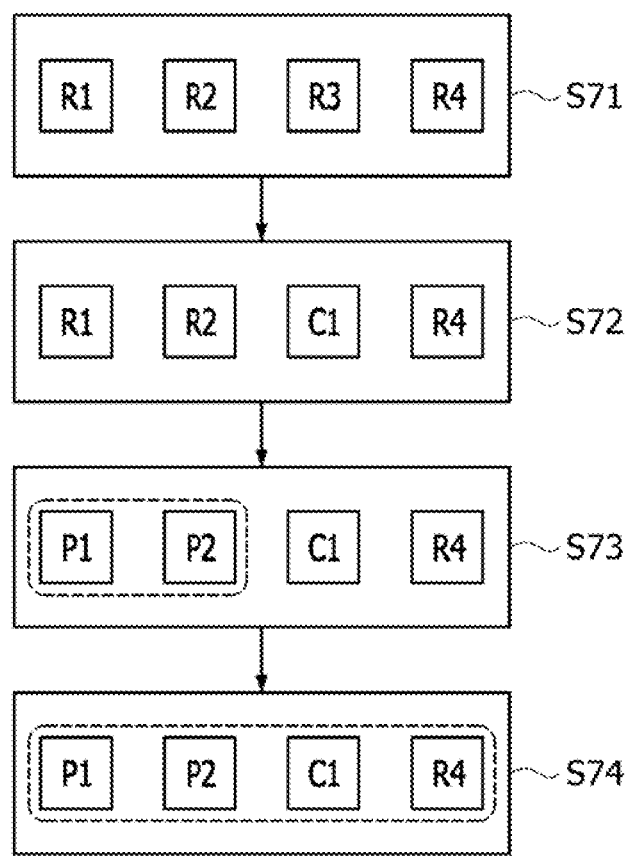
Figure 20:
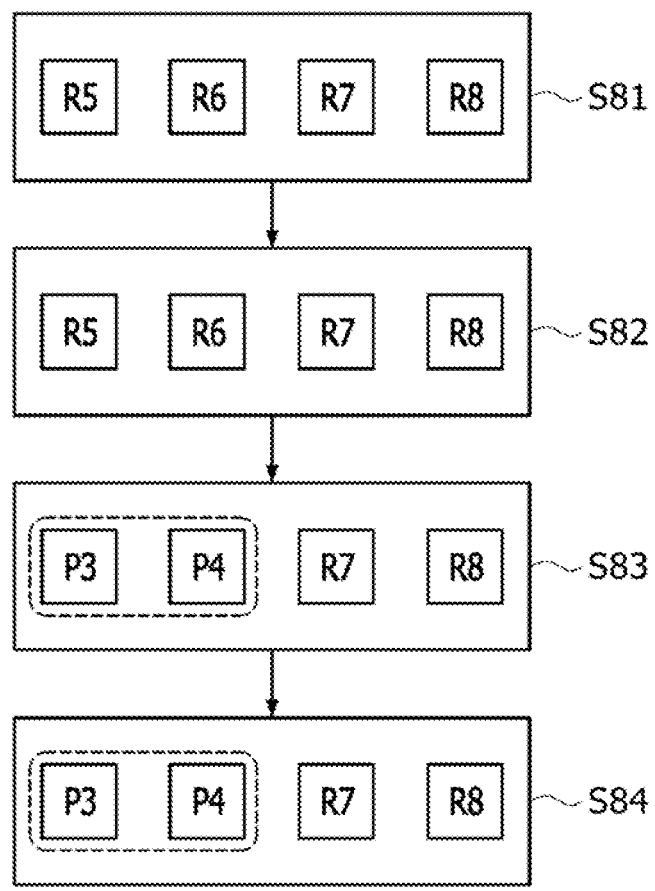

FIGS. 19 and 20 are schematic views illustrating read-modify-write operations performed in the semiconductor device of FIG. 1.

Figure 21:
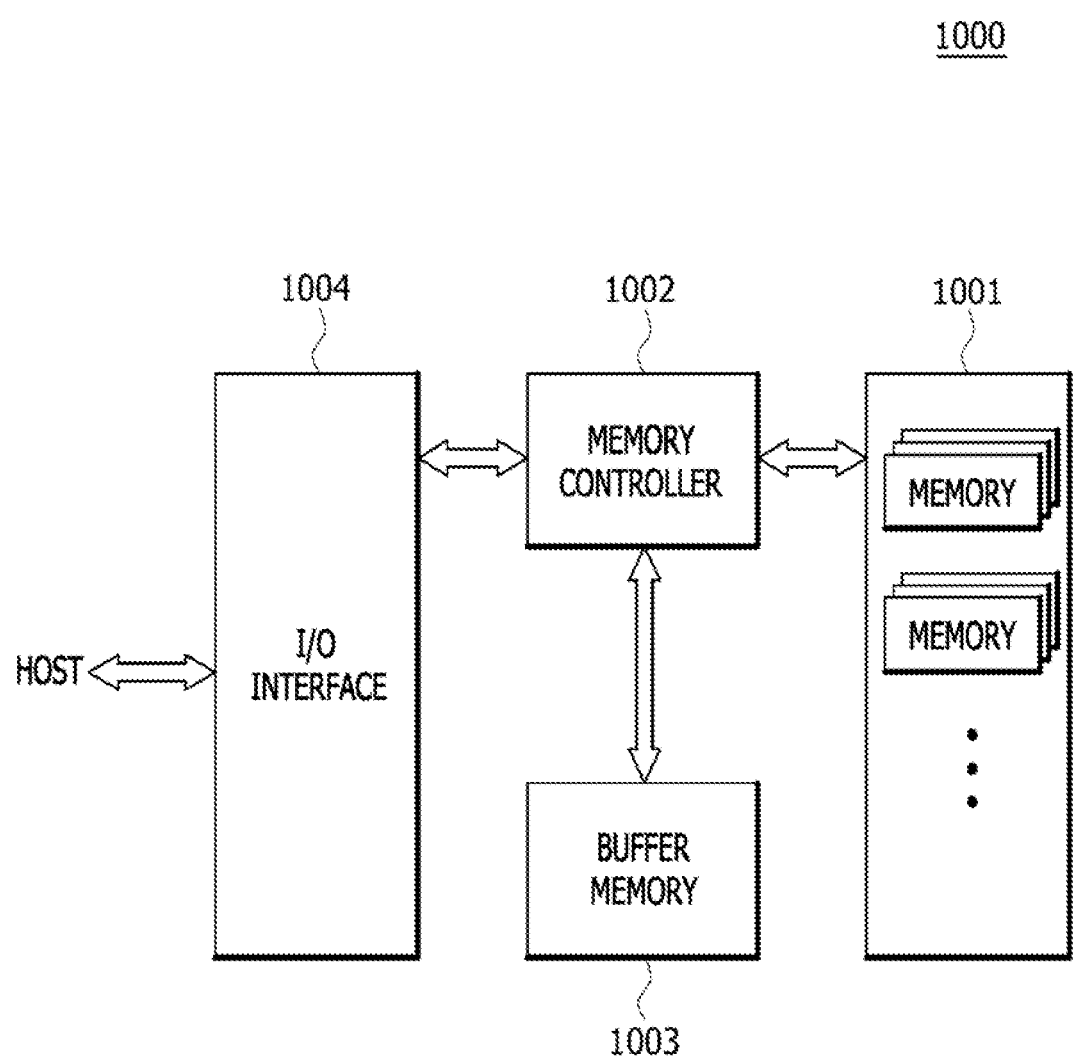

FIG. 21 is a block diagram illustrating a configuration of an electronic system employing the semiconductor device shown in FIG. 1.

DETAILED DESCRIPTION OF THE EMBODIMENTS

Various embodiments of the present disclosure are described hereinafter with reference to the accompanying drawings. However, the embodiments described herein are for illustrative purposes only and are not intended to limit the scope of the present disclosure.

As illustrated in FIG. 1, a semiconductor device 100 according to an embodiment may include a command pulse generation circuit 10, a strobe pulse generation circuit 11, an address latch circuit 12, a read operation control circuit 13, a core circuit 14, an error correction circuit 15, a write operation control circuit 17, a pad circuit 18, and a write data generation circuit 19.

The command pulse generation circuit 10 may generate a read pulse RDP and a write pulse WTP based on a control command RMW. The control command RMW may be generated to perform a read-modify-write operation. The read-modify-write operation may be performed to include a read operation for outputting data stored in a cell array, an error correction operation for correcting errors included in the data which are read out of the cell array, and a write operation for storing the corrected data into the cell array. For an embodiment, the read-modify-write operation may be performed to provide necessary data of a code word when the number of bits included in the code word is insufficient in using an error correction code (ECC). The control command RMW may be generated by decoding a command provided by an external device. The command pulse generation circuit 10 may generate the read pulse RDP and the write pulse WTP when the control command RMW is generated. The command pulse generation circuit 10 may generate the read pulse RDP at a time when a first delay period (Itd1 of FIG. 6) elapses from a time when the control command RMW is generated. The command pulse generation circuit 10 may generate the write pulse WTP at a time when a second delay period (Itd2 of FIG. 6) elapses from a time when the control command RMW is generated. The second delay period (Itd2 of FIG. 6) may be set to be greater than the first delay period (Itd1 of FIG. 6).

The strobe pulse generation circuit 11 may generate first to $G^{th}$ read strobe pulses RCASP<1:G> and first to $H^{th}$ write strobe pulses WCASP<1:H> based on the read pulse RDP and the write pulse WTP. The strobe pulse generation circuit 11 may generate the first to $G^{th}$ read strobe pulses RCASP<1:G> when the read pulse RDP is generated. In some embodiments, the first to $G^{th}$ read strobe pulses RCASP<1:G> may be simultaneously generated or may be generated at different times. The strobe pulse generation circuit 11 may generate the first to $H^{th}$ write strobe pulses WCASP<1:H> when the write pulse WTP is generated. The first to $H^{th}$ write strobe pulses WCASP<1:H> may be generated to have a logic "high" level. The first to $H^{th}$ write strobe pulses WCASP<1:H> may be simultaneously generated or may be generated at different times. In the first to $G^{th}$ read strobe pulses RCASP<1:G> and the first to $H^{th}$ write strobe pulses WCASP<1:H>, the numbers 'G' and 'H' may be set as natural numbers which are equal to or greater than two and may be set to be identical to each other or different from each other according to the embodiments.

The address latch circuit 12 may generate first to $J^{th}$ bit change signals XC<1:J>, first to $K^{th}$ burst change signals BC<1:K>, and first to $P^{th}$ data mask signals DM<1:P> from first to $I^{th}$ addresses ADD<1:I> based on the write pulse WTP. The address latch circuit 12 may latch the first to $I^{th}$ addresses ADD<1:I> to generate the first to $J^{th}$ bit change signals XC<1:J>, the first to $K^{th}$ burst change signals BC<1:K>, and the first to $P^{th}$ data mask signals DM<1:P> when the write pulse WTP is generated. The first to $J^{th}$ bit change signals XC<1:J> may be set to have a logic level combination for setting the number of pads receiving data during the write operation. The logic level combination of the first to $J^{th}$ bit change signals XC<1:J> may be set to be different according to the embodiments. The first to $K^{th}$ burst change signals BC<1:K> may be set to have a logic level combination for setting a burst length. The logic level combination of the first to $K^{th}$ burst change signals BC<1:K> may be set to be different according to the embodiments. The first to $P^{th}$ data mask signals DM<1:P> may be set to have a logic level combination for selecting pads that block the input of data during the write operation. The logic level combination of the first to $P^{th}$ data mask signals DM<1:P> may be set to be different according to the embodiments. Addresses for generating the first to $J^{th}$ bit change signals XC<1:J>, the first to $K^{th}$ burst change signals BC<1:K>, and the first to $P^{th}$ data mask signals DM<1:P> among the first to $I^{th}$ addresses ADD<1:I> may be set to be different according to the embodiments. In the first to $I^{th}$ addresses ADD<1:I>, the first to $J^{th}$ bit change signals XC<1:J>, the first to $K^{th}$ burst change signals BC<1:K>, and the first to $P^{th}$ data mask signals DM<1:P>, the numbers 'I', 'J', 'K', and 'P' may be set as natural numbers which are equal to or greater than two, and the number 'I' may be set to be equal to or greater than a sum of the numbers 'J', 'K', and 'P'. A configuration and an operation of the address latch circuit 12 is described more fully with reference to FIGS. 2 and 3 later.

The read operation control circuit 13 may generate first to $L^{th}$ read control signals RCNT<1:L> based on the first to $G^{th}$ read strobe pulses RCASP<1:G>. The read operation control circuit 13 may decode the first to $G^{th}$ read strobe pulses RCASP<1:G> to generate the first to $L^{th}$ read control signals RCNT<1:L>. A logic level combination of the first to $L^{th}$ read control signals RCNT<1:L> generated according to a logic level combination of the first to $G^{th}$ read strobe pulses RCASP<1:G> may be set to be different according to the embodiments. In the first to $G^{th}$ read strobe pulses RCASP<1:G> and the first to $L^{th}$ read control signals RCNT<1:L>, the numbers 'G' and 'L' may be set as natural numbers which are equal to or greater than two and may be set to be identical to each other or different from each other according to the embodiments. The first to $L^{th}$ read control signals RCNT<1:L> may be set to have a logic level combination for controlling first to $N^{th}$ read data RDATA<1:N> being outputted from the core circuit 14 when the read operation is performed.

Figure 15:
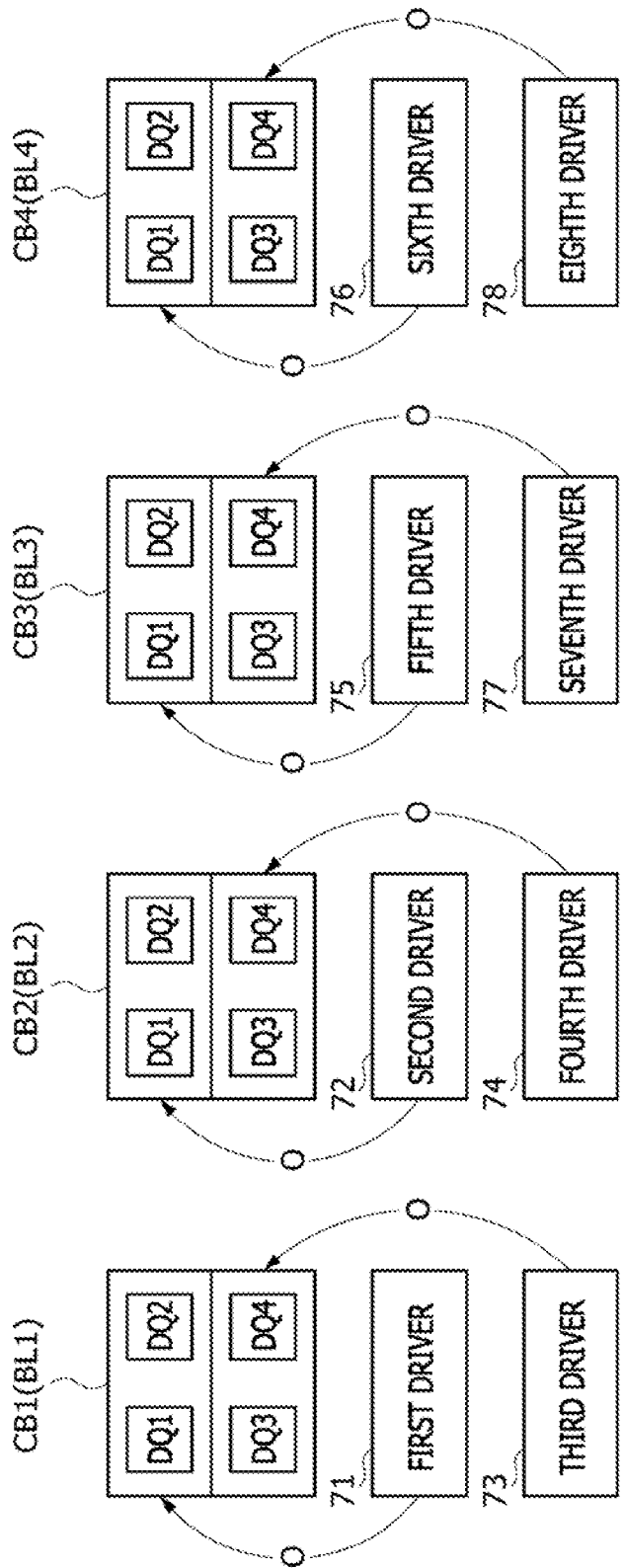

The core circuit 14 may perform the read operation based on the first to $L^{th}$ read control signals RCNT<1:L> to output the first to $N^{th}$ read data RDATA<1:N> stored in cell blocks (CB1~CB4 of FIG. 15). The first to $L^{th}$ read control signals RCNT<1:L> may include an input/output (I/O) line sense amplification signal and an output selection signal which are used for the read operation. The I/O line sense amplification signal may be a signal for activating an I/O line sense amplifier which is used for outputting data during the read operation, and the output selection signal may be a signal for data transmission between I/O lines during the read operation. In the first to $L^{th}$ read control signals RCNT<1:L> and the first to $N^{th}$ read data RDATA<1:N>, the numbers 'L' and 'N' may be set as natural numbers which are equal to or greater than two and may be set to be identical to each other or different from each other according to the embodiments.

The core circuit 14 may perform the write operation based on first to $N^{th}$ write control signals WCNT<1:N> to receive and store first to $N^{th}$ write data WDATA<1:N> into the cell blocks (CB1~CB4 of FIG. 15). The first to $N^{th}$ write control signals WCNT<1:N> may include a write enablement signal and the output selection signal which are used for the write operation. The write enablement signal may be a signal for activating a write driver which is used for inputting data during the write operation, and the output selection signal may be a signal for data transmission between the I/O lines during the write operation.

The error correction circuit 15 may generate a write period signal WPD, an error flag EFLAG, and first to $N^{th}$ corrected data CDATA<1:N> from the first to $N^{th}$ read data RDATA<1:N> based on the read pulse RDP and the write pulse WTP. The error correction circuit 15 may generate the write period signal WPD which is enabled during a period (tWT of FIG. 6) that the write operation activated by the write pulse WTP is performed. A logic level of the write period signal WPD which is enabled may be set to be different according to the embodiments. The error correction circuit 15 may generate the error flag EFLAG which is enabled when the first to $N^{th}$ read data RDATA<1:N> are erroneous data during a period (tRD of FIG. 6) that the read operation activated by the read pulse RDP is performed and may generate the error flag EFLAG which is disabled when no error is included in the first to $N^{th}$ read data RDATA<1:N> during the period (tRD of FIG. 6) that the read operation activated by the read pulse RDP is performed. A logic level of the error flag EFLAG which is enabled and a logic level of the error flag EFLAG which is disabled may be set to be different according to the embodiments. The error correction circuit 15 may correct an error included in the first to $N^{th}$ read data RDATA<1:N> to generate the first to $N^{th}$ corrected data CDATA<1:N> when the first to $N^{th}$ read data RDATA<1:N> are erroneous data. The error correction circuit 15 may output the first to $N^{th}$ read data RDATA<1:N> as the first to $N^{th}$ corrected data CDATA<1:N> when no error is included in the first to $N^{th}$ read data RDATA<1:N>. A configuration and an operation of the error correction circuit 15 is described more fully with reference to FIGS. 4 to 6 later.

The write operation control circuit 17 may generate the first to $N^{th}$ write control signals WCNT<1:N> based on the write period signal WPD, the error flag EFLAG, the first to $H^{th}$ write strobe pulses WCASP<1:H>, the first to $J^{th}$ bit change signals XC<1:J>, the first to $K^{th}$ burst change signals BC<1:K>, and the first to $P^{th}$ data mask signals DM<1:P>. The write operation control circuit 17 may decode the first to $H^{th}$ write strobe pulses WCASP<1:H> to generate the first to $N^{th}$ write control signals WCNT<1:N> during the period (tWT of FIG. 6) that the write operation is performed by the write period signal WPD, which is enabled, when the error flag EFLAG is enabled. A logic level combination of the first to $N^{th}$ write control signals WCNT<1:N> generated according to a logic level combination of the first to $H^{th}$ write strobe pulses WCASP<1:H> may be set to be different according to the embodiments. The write operation control circuit 17 may decode the first to $H^{th}$ write strobe pulses WCASP<1:H>, the first to $J^{th}$ bit change signals XC<1:J>, the first to $K^{th}$ burst change signals BC<1:K>, and the first to $P^{th}$ data mask signals DM<1:P> to generate the first to $N^{th}$ write control signals WCNT<1:N> during the period that the write operation is performed when the error flag EFLAG is disabled. A logic level combination of the first to $N^{th}$ write control signals WCNT<1:N> generated according to logic level combinations of the first to $H^{th}$ write strobe pulses WCASP<1:H>, the first to $J^{th}$ bit change signals XC<1:J>, the first to $K^{th}$ burst change signals BC<1:K>, and the first to $P^{th}$ data mask signals DM<1:P> may be set to be different according to the embodiments. The first to $N^{th}$ write control signals WCNT<1:N> may be set to have a logic level combination for controlling that the first to $N^{th}$ write data WDATA<1:N> are inputted to the core circuit 14 when the write operation is performed. A configuration and an operation of the write operation control circuit 17 is described more fully with reference to FIGS. 7 to 13 later.

The write data generation circuit 19 may generate the first to $N^{th}$ write data WDATA<1:N> from the first to $N^{th}$ corrected data CDATA<1:N> and first to $N^{th}$ pad data PDATA<1:N> based on the first to $N^{th}$ write control signals WCNT<1:N>. The first to $N^{th}$ pad data PDATA<1:N> may be inputted to the write data generation circuit 19 through the pad circuit 18. The write data generation circuit 19 may replace some data of the first to $N^{th}$ corrected data CDATA<1:N> with the corresponding pad data selected according to a logic level combination of the first to $N^{th}$ write control signals WCNT<1:N> among the first to $N^{th}$ pad data PDATA<1:N> and may output the first to $N^{th}$ corrected data CDATA<1:N> including the replaced corrected data as the first to $N^{th}$ write data WDATA<1:N>. For example, the write data generation circuit 19 may replace the first to third corrected data CDATA<1:3> with the first to third pad data PDATA<1:3> selected according to a logic level combination of the first to $N^{th}$ write control signals WCNT<1:N> and may output the first to $N^{th}$ corrected data CDATA<1:N> including the first to third pad data PDATA<1:3> as the first to $N^{th}$ write data WDATA<1:N>. That is, the first to third write data WDATA<1:3> among the first to $N^{th}$ write data WDATA<1:N> may be generated by the first to third pad data PDATA<1:3>, and the fourth to $N^{th}$ write data WDATA<4:N> among the first to $N^{th}$ write data WDATA<1:N> may be generated by the fourth to $N^{th}$ corrected data CDATA<4:N>. A configuration and an operation of the write data generation circuit 19 is described more fully with reference to FIG. 14 later.

Referring to FIG. 2, the address latch circuit 12 may include a first group address latch circuit 21, a second group address latch circuit 23, and a third group address latch circuit 25. The first group address latch circuit 21 may latch the first to $J^{th}$ addresses ADD<1:J> when the write pulse WTP is generated and may output the latched signals of the first to $J^{th}$ addresses ADD<1:J> as the first to $J^{th}$ bit change signals XC<1:J>. The first group address latch circuit 21 may include first to $J^{th}$ address latches 21(1), . . . , and 21(J). The first address latch 21(1) may latch the first address ADD<1> when the write pulse WTP is generated and may output the latched signal of the first address ADD<1> as the first bit change signal XC<1>. The $J^{th}$ address latch 21(J) may latch the $J^{th}$ address ADD<J> when the write pulse WTP is generated and may output the latched signal of the $J^{th}$ address ADD<J> as the $J^{th}$ bit change signal XC<J>. The second group address latch circuit 23 may latch the $(J+1)^{th}$ to $(J+K)^{th}$ addresses ADD<J+1:J+K> when the write pulse WTP is generated and may output the latched signals of the $(J+1)^{th}$ to $(J+K)^{th}$ addresses ADD<J+1:J+K> as the first to $K^{th}$ burst change signals BC<1:K>. The third group address latch circuit 25 may latch the $(J+K+1)^{th}$ to $(J+K+P)^{th}$ addresses ADD<J+K+1:J+K+P> when the write pulse WTP is generated and may output the latched signals of the $(J+K+1)^{th}$ to $(J+K+P)^{th}$ addresses ADD<J+K+1:J+K+P> as the first to $P^{th}$ data mask signals DM<1:P>.

Referring to FIG. 3, the first address latch 21(1) may include inverters IV21, IV23, IV25, and IV27. The inverter IV21 may inversely buffer the write pulse WTP to output the inversely buffered signal of the write pulse WTP. The inverter IV23 may inversely buffer the first address ADD<1> to output the inversely buffered signal of the first address ADD<1> to a node nd21 when the write pulse WTP has a logic "high" level. The inverter IV25 may inversely buffer a signal of the node nd21 to output the inversely buffered signal of the signal of the node nd21 as the first bit change signal XC<1> through a node nd22. The inverter IV27 may inversely buffer a signal of the node nd22 to output the inversely buffered signal of the signal of the node nd22 to the node nd21. The first address latch 21(1) may latch the first address ADD<1> when the write pulse WTP has a logic "high" level and may output the latched signal of the first address ADD<1> as the first bit change signal XC<1>.

Referring to FIG. 4, the error correction circuit 15 may include a syndrome generation circuit 31, an error flag generation circuit 33, and a corrected data generation circuit 35.

The syndrome generation circuit 31 may generate first to $T^{th}$ syndrome signals SYN<1:T> from the first to $N^{th}$ read data RDATA<1:N>. The syndrome generation circuit 31 may generate the first to $T^{th}$ syndrome signals SYN<1:T> from the first to $N^{th}$ read data RDATA<1:N> using an error correction code (ECC). The first to $T^{th}$ syndrome signals SYN<1:T> may include information on whether the first to $N^{th}$ read data RDATA<1:N> have an error. For example, no error may be included in the first to $N^{th}$ read data RDATA<1:N> when all of the first to $T^{th}$ syndrome signals SYN<1:T> are generated to have a logic "low" level, and an error may be included in the first to $N^{th}$ read data RDATA<1:N> when at least one of the first to $T^{th}$ syndrome signals SYN<1:T> is generated to have a logic "high" level. It may be possible to figure out an erroneous datum among the first to $N^{th}$ read data RDATA<1:N> according to a logic level combination of the first to $T^{th}$ syndrome signals SYN<1:T>. In the first to $N^{th}$ read data RDATA<1:N> and the first to $T^{th}$ syndrome signals SYN<1:T>, the numbers 'N' and 'T' may be set as natural numbers which are equal to or greater than two, and the number 'T' may be set to be equal to or less than the number 'N'.

The error flag generation circuit 33 may generate the write period signal WPD and the error flag EFLAG based on the read pulse RDP, the write pulse WTP, and the first to $T^{th}$ syndrome signals SYN<1:T>. The error flag generation circuit 33 may generate the write period signal WPD which is enabled during the period (tWT of FIG. 6) that the write operation activated by the write pulse WTP is performed. The error flag generation circuit 33 may generate the error flag EFLAG according to a logic level combination of the first to $T^{th}$ syndrome signals SYN<1:T> during the period (tRD of FIG. 6) that the read operation activated by the read pulse RDP is performed. For example, the error flag generation circuit 33 may generate the error flag EFLAG which is disabled to have a logic "low" level when all of the first to $T^{th}$ syndrome signals SYN<1:T> have a logic "low" level and may generate the error flag EFLAG which is enabled to have a logic "high" level when at least one of the first to $T^{th}$ syndrome signals SYN<1:T> has a logic "high" level. A logic level of the error flag EFLAG generated according to a logic level combination of the first to $T^{th}$ syndrome signals SYN<1:T> may be set to be different according to the embodiments. A configuration and an operation of the error flag generation circuit 33 are described more fully with reference to FIGS. 5 and 6 later.

The corrected data generation circuit 35 may generate the first to $N^{th}$ corrected data CDATA<1:N> from the first to $N^{th}$ read data RDATA<1:N> based on the first to $T^{th}$ syndrome signals SYN<1:T>. The corrected data generation circuit 35 may output the first to $N^{th}$ read data RDATA<1:N> as the first to $N^{th}$ corrected data CDATA<1:N> when the first to $N^{th}$ read data RDATA<1:N> having no errors is confirmed by the first to $T^{th}$ syndrome signals SYN<1:T>. When the first to $N^{th}$ read data RDATA<1:N> having an error is confirmed by the first to $T^{th}$ syndrome signals SYN<1:T>, the corrected data generation circuit 35 may correct the error included in the first to $N^{th}$ read data RDATA<1:N> according to a logic level combination of the first to $T^{th}$ syndrome signals SYN<1:T> and may output the corrected data of the first to $N^{th}$ read data RDATA<1:N> as the first to $N^{th}$ corrected data CDATA<1:N>.

Referring to FIG. 5, the error flag generation circuit 33 may include a period signal generation circuit 41, a pre-flag generation circuit 43, and an error flag output circuit 45.

The period signal generation circuit 41 may generate a read period signal RPD, an inverted read period signal RPDB, and the write period signal WPD based on the read pulse RDP and the write pulse WTP. The read period signal RPD may be enabled to have a logic "high" level during the period (tRD of FIG. 6) that the read operation activated by the read pulse RDP is performed. The inverted read period signal RPDB may be enabled to have a logic "low" level during the read operation. The write period signal WPD may be enabled to have a logic "high" level during the period (tWT of FIG. 6) that the write operation activated by the write pulse WTP is performed. Logic levels of the read period signal RPD, the inverted read period signal RPDB, and the write period signal WPD, which are enabled, may be set to be different according to the embodiments.

The pre-flag generation circuit 43 may generate a pre-flag FPRE according to a logic level combination of the first to $T^{th}$ syndrome signals SYN<1:T>. The pre-flag generation circuit 43 may generate the pre-flag FPRE which is set to have a logic "low" level when all of the first to $T^{th}$ syndrome signals SYN<1:T> have a logic "low" level and may generate the pre-flag FPRE which is set to have a logic "high" level when at least one of the first to $T^{th}$ syndrome signals SYN<1:T> has a logic "high" level. A logic level of the pre-flag FPRE generated according to a logic level combination of the first to $T^{th}$ syndrome signals SYN<1:T> may be set to be different according to the embodiments.

The error flag output circuit 45 may include a transfer gate T41, a NAND gate NAND41, and inverters IV41 and IV42. The transfer gate T41 may be turned on by the read period signal RPD having a logic "high" level and the inverted read period signal RPDB having a logic "low" level during the read operation, thereby outputting the pre-flag FPRE to a node nd41. The NAND gate NAND41 may perform a logical NAND operation of a signal of the node nd41 and the write period signal WPD to output a result of the logical NAND operation to a node nd42. The inverter IV41 may inversely buffer a signal of the node nd42 to output the inversely buffered signal of the signal of the node nd42 to the node nd41 when the read period signal RPD has a logic "low" level and the inverted read period signal RPDB has a logic "high" level while the read operation is not performed. The inverter IV42 may inversely buffer a signal of the node nd42 to output the inversely buffered signal of the signal of the node nd42 as the error flag EFLAG.

An operation of the error flag generation circuit 33 is described hereinafter with reference to FIG. 6.

As illustrated in FIG. 6, the read pulse RDP may be created at a time "T12" when the first delay period Itd1 elapses from a time "T11" when the control command RMW is created, and the write pulse WTP may be created at a time "T13" when the second delay period Itd2 elapses from the time "T11" when the control command RMW is created. The read period signal RPD may be enabled to have a logic "high" level during the period tRD that the read operation activated by the read pulse RDP is performed. The write period signal WPD may be enabled to have a logic "high" level during the period tWT that the write operation activated by the write pulse WTP is performed. The error flag generation circuit 33 may buffer the pre-flag FPRE generated according to a logic level combination of the first to $T^{th}$ syndrome signals SYN<1:T> to output the buffered signal of the pre-flag FPRE as the error flag EFLAG during the period tRD that the read operation is performed. The error flag generation circuit 33 may latch the error flag EFLAG to uniformly maintain a logic level of the error flag EFLAG during a period that the read operation is not performed.

Referring to FIG. 7, the write operation control circuit 17 may include a column decoding circuit 51, a mask control circuit 53, and a write control signal generation circuit 55. The write operation control circuit 17 illustrated in FIG. 7 may operate to receive the error flag EFLAG, the first to eighth write strobe pulses WCASP<1:8>, the first and second bit change signals XC<1:2>, and the first and second burst change signals BC<1:2>, and the first to eighth data mask signals DM<1:8> to generate the first to eighth write control signals WCNT<1:8>.

The column decoding circuit 51 may generate first to eighth pre-decoded signals PDEC<1:8> from the first to eighth write strobe pulses WCASP<1:8>, the first and second bit change signals XC<1:2>, and the first and second burst change signals BC<1:2> based on the error flag EFLAG. The column decoding circuit 51 may generate the first to eighth pre-decoded signals PDEC<1:8> from the first to eighth write strobe pulses WCASP<1:8> when the error flag EFLAG is enabled due to the first to N$^{th}$ read data RDATA<1:N> including an error. The column decoding circuit 51 may buffer the first to eighth write strobe pulses WCASP<1:8> to generate the first to eighth pre-decoded signals PDEC<1:8> when the error flag EFLAG, which is enabled, is inputted to the column decoding circuit 51. The column decoding circuit 51 may generate the first to eighth pre-decoded signals PDEC<1:8> from the first and second bit change signals XC<1:2>, the first and second burst change signals BC<1:2>, and the first to eighth write strobe pulses WCASP<1:8> when the error flag EFLAG is disabled due to the first to N$^{th}$ read data RDATA<1:N> without any error. The column decoding circuit 51 may selectively buffer the first to eighth write strobe pulses WCASP<1:8> according to a logic level combination of the first and second bit change signals XC<1:2> and the first and second burst change signals BC<1:2> to generate the first to eighth pre-decoded signals PDEC<1:8> when the error flag EFLAG, which is disabled, is inputted to the column decoding circuit 51.

The mask control circuit 53 may generate first to eighth decoded signals DEC<1:8> from the first to eighth pre-decoded signals PDEC<1:8> based on the error flag EFLAG and the first to eighth data mask signals DM<1:8>. The mask control circuit 53 may generate the first to eighth decoded signals DEC<1:8> from the first to eighth pre-decoded signals PDEC<1:8> when the error flag EFLAG is enabled due to the first to N$^{th}$ read data RDATA<1:N> including an error. The mask control circuit 53 may buffer the first to eighth pre-decoded signals PDEC<1:8> to generate the first to eighth decoded signals DEC<1:8> when the error flag EFLAG, which is enabled, is inputted to the mask control circuit 53. The mask control circuit 53 may generate the first to eighth decoded signals DEC<1:8> such that only a signal selected by the first to eighth data mask signals DM<1:8> among the first to eighth decoded signals DEC<1:8> has a predetermined logic level when the error flag EFLAG is disabled due to the first to N$^{th}$ read data RDATA<1:N> without any error. For example, when only the second data mask signal DM<2> among the first to eighth data mask signals DM<1:8> has a logic "high" level while all of the first to eighth pre-decoded signals PDEC<1:8> are set to have a logic "high" level, only the second decoded signal DEC<2> among the first to eighth decoded signals DEC<1: 8> might be set to have a logic "low" level.

The write control signal generation circuit 55 may generate the first to eighth write control signals WCNT<1:8> from the first to eighth decoded signals DEC<1:8> based on the write period signal WPD. The write control signal generation circuit 55 may generate the first to eighth write control signals WCNT<1:8>, all of which are set to have a logic "low" level during a period that the write operation is not performed. The write control signal generation circuit 55 may buffer the first to eighth decoded signals DEC<1:8> to generate the first to eighth write control signals WCNT<1: 8> during a period that the write period signal WPD is set to have a logic "high" level by execution of the write operation.

Referring to FIG. 8, the column decoding circuit 51 may include a first column decoder 61, a second column decoder 63, a third column decoder 65, and a fourth column decoder 67.

The first column decoder 61 may generate the first and second pre-decoded signals PDEC<1:2> from the first and second write strobe pulses WCASP<1:2> based on the error flag EFLAG, the first bit change signal XC<1>, and the first burst change signal BC<1>. The first column decoder 61 may buffer the first and second write strobe pulses WCASP<1:2> to generate the first and second pre-decoded signals PDEC<1:2> when the error flag EFLAG enabled to have a logic "high" level is inputted to the first column decoder 61. The first column decoder 61 may generate the first and second pre-decoded signals PDEC<1:2>, all of which are set to have a logic "low" level when the error flag EFLAG disabled to have a logic "low" level is inputted to the first column decoder 61 and both of the first bit change signal XC<1> and the first burst change signal BC<1> are set to have a logic "low" level.

The second column decoder 63 may generate the third and fourth pre-decoded signals PDEC<3:4> from the third and fourth write strobe pulses WCASP<3:4> based on the error flag EFLAG, the second bit change signal XC<2>, and the first burst change signal BC<1>. The second column decoder 63 may buffer the third and fourth write strobe pulses WCASP<3:4> to generate the third and fourth pre-decoded signals PDEC<3:4> when the error flag EFLAG enabled to have a logic "high" level is inputted to the second column decoder 63. The second column decoder 63 may generate the third and fourth pre-decoded signals PDEC<3: 4>, all of which are set to have a logic "low" level when the error flag EFLAG disabled to have a logic "low" level is inputted to the second column decoder 63 and both of the second bit change signal XC<2> and the first burst change signal BC<1> are set to have a logic "low" level.

The third column decoder 65 may generate the fifth and sixth pre-decoded signals PDEC<5:6> from the fifth and sixth write strobe pulses WCASP<5:6> based on the error flag EFLAG, the first bit change signal XC<1>, and the second burst change signal BC<2>. The third column decoder 65 may buffer the fifth and sixth write strobe pulses WCASP<5:6> to generate the fifth and sixth pre-decoded signals PDEC<5:6> when the error flag EFLAG enabled to have a logic "high" level is inputted to the third column decoder 65. The third column decoder 65 may generate the fifth and sixth pre-decoded signals PDEC<5:6>, all of which are set to have a logic "low" level when the error flag EFLAG disabled to have a logic "low" level is inputted to the third column decoder 65 and both of the first bit change signal XC<1> and the second burst change signal BC<2> are set to have a logic "low" level.

The fourth column decoder 67 may generate the seventh and eighth pre-decoded signals PDEC<7:8> from the seventh and eighth write strobe pulses WCASP<7:8> based on the error flag EFLAG, the second bit change signal XC<2>, and the second burst change signal BC<2>. The fourth column decoder 67 may buffer the seventh and eighth write strobe pulses WCASP<7:8> to generate the seventh and eighth pre-decoded signals PDEC<7:8> when the error flag EFLAG enabled to have a logic "high" level is inputted to the fourth column decoder 67. The fourth column decoder 67 may generate the seventh and eighth pre-decoded signals PDEC<7:8>, all of which are set to have a logic "low" level when the error flag EFLAG disabled to have a logic "low" level is inputted to the fourth column decoder 67 and both of the second bit change signal XC<2> and the second burst change signal BC<2> are set to have a logic "low" level.

Referring to FIG. 9, the first column decoder 61 may include an inverter IV61 and NOR gates NOR61 and NOR62. The inverter IV61 may inversely buffer the first and second write strobe pulses WCASP<1:2> to output the inversely buffered signals of the first and second write strobe pulses WCASP<1:2>. The NOR gate NOR61 may receive the error flag EFLAG, the first bit change signal XC<1>, and the first burst change signal BC<1> to perform a logical NOR operation of the error flag EFLAG, the first bit change signal XC<1>, and the first burst change signal BC<1>. The NOR gate NOR62 may perform a logical NOR operation of an output signal of the inverter IV61 and an output signal of the NOR gate NOR61 to generate the first and second pre-decoded signals PDEC<1:2>. The first column decoder 61 may buffer the first and second write strobe pulses WCASP<1:2> to generate the first and second pre-decoded signals PDEC<1:2> when the error flag EFLAG enabled to have a logic "high" level is inputted to the first column decoder 61. The first column decoder 61 may generate the first and second pre-decoded signals PDEC<1:2>, all of which are set to have a logic "low" level when the error flag EFLAG disabled to have a logic "low" level is inputted to the first column decoder 61 and both of the first bit change signal XC<1> and the first burst change signal BC<1> are set to have a logic "low" level.

Referring to FIG. 10, various logic level combinations of the first to eighth pre-decoded signals PDEC<1:8> generated according to various logic level combinations of the first and second bit change signals XC<1:2> and the first and second burst change signals BC<1:2> are listed. In a first case "CASE1" that the first and second bit change signals XC<1:2> have a logic level combination of 'H,H' and the first and second burst change signals BC<1:2> have a logic level combination of 'H,H', all of the first to eighth pre-decoded signals PDEC<1:8> may be set to have a logic "high(H)" level. In the first and second bit change signals XC<1:2>, the logic level combination of 'H,H' means that the first bit change signal XC<1> is set to have a logic "high" level and the second bit change signal XC<2> is set to have a logic "high" level. In a second case "CASE2" that the first and second bit change signals XC<1:2> have a logic level combination of 'H,L' and the first and second burst change signals BC<1:2> have a logic level combination of 'L,L', both of the first and second pre-decoded signals PDEC<1:2> may be set to have a logic "high(H)" level, both of the third and fourth pre-decoded signals PDEC<3:4> may be set to have a logic "low(L)" level, both of the fifth and sixth pre-decoded signals PDEC<5:6> may be set to have a logic "high(H)" level, and both of the seventh and eighth pre-decoded signals PDEC<7:8> may be set to have a logic "low(L)" level. In the first and second bit change signals XC<1:2>, the logic level combination of 'H,L' means that the first bit change signal XC<1> is set to have a logic "high" level and the second bit change signal XC<2> is set to have a logic "low" level. In a third case "CASE3" that the first and second bit change signals XC<1:2> have a logic level combination of 'L,L' and the first and second burst change signals BC<1:2> have a logic level combination of 'H,L', all of the first to fourth pre-decoded signals PDEC<1:4> may be set to have a logic "high(H)" level and all of the fifth to eighth pre-decoded signals PDEC<5:8> may be set to have a logic "low(L)" level.

Referring to FIG. 11, the mask control circuit 53 may include an inverter IV63 and NOR gates NOR63 and NOR65. The inverter IV63 may inversely buffer the first to eighth pre-decoded signals PDEC<1:8> to output the inversely buffered signals of the first to eighth pre-decoded signals PDEC<1:8>. The NOR gate NOR63 may receive the error flag EFLAG and the first to eighth data mask signals DM<1:8> to perform a logical NOR operation of the error flag EFLAG and the first to eighth data mask signals DM<1:8>. The NOR gate NOR65 may perform a logical NOR operation of an output signal of the inverter IV63 and an output signal of the NOR gate NOR63 to generate the first to eighth decoded signals DEC<1:8>. The mask control circuit 53 may buffer the first to eighth pre-decoded signals PDEC<1:8> to generate the first to eighth decoded signals DEC<1:8> when the error flag EFLAG enabled to have a logic "high" level is inputted to the mask control circuit 53. The mask control circuit 53 may be realized such that only a signal selected by the first to eighth data mask signals DM<1:8> among the first to eighth decoded signals DEC<1:8> has a logic "low" level when the error flag EFLAG disabled to have a logic "low" level is inputted to the mask control circuit 53.

Referring to FIG. 12, a logic level combination of the first to eighth decoded signals DEC<1:8> generated according to a logic level combination of the first to eighth data mask signals DM<1:8> is listed. In a fourth case "CASE4" that only the second data mask signal DM<2> among the first to eighth data mask signals DM<1:8> has a logic "low(L)" level while all of the first to eighth pre-decoded signals PDEC<1:8> are set to have a logic "high" level by execution of the write operation, the first decoded signal DEC<1> may be set to have a logic "high(H)" level, the second decoded signal DEC<2> may be set to have a logic "low(L)" level, and all of the third to eighth decoded signals DEC<3:8> may be set to have a logic "high(H)" level. That is, only the second decoded signal DEC<2> among the first to eighth decoded signals DEC<1:8> might be set to have a logic "low(L)" level by the second data mask signal DM<2> which is set to have a logic "low(L)" level.

Referring to FIG. 13, the write control signal generation circuit 55 may include a NAND gate NAND71 and an inverter IV71. The NAND gate NAND71 may receive the first to eighth decoded signals DEC<1:8> and the write period signal WPD to perform a logical NAND operation of the first to eighth decoded signals DEC<1:8> and the write period signal WPD. The inverter IV71 may inversely buffer an output signal of the NAND gate NAND71 to generate the first to eighth write control signals WCNT<1:8>. The write control signal generation circuit 55 may generate the first to eighth write control signals WCNT<1:8> which are set to have a logic "low" level when the write period signal WPD has a logic "low" level. The write control signal generation circuit 55 may buffer the first to eighth decoded signals DEC<1:8> to generate the first to eighth write control signals WCNT<1:8> when the write period signal WPD has a logic "high" level.

Referring to FIG. 14, the write data generation circuit 19 may include first to $N^{th}$ data replacement circuits 6(1), . . . , and 6(N). The first data replacement circuit 6(1) may generate the first write data WDATA<1> from the first corrected data CDATA<1> and the first pad data PDATA<1> based on the first write control signal WCNT<1>. The first data replacement circuit 6(1) may output the first pad data PDATA<1> as the first write data WDATA<1> when the first write control signal WCNT<1> has a logic "high" level. The first data replacement circuit 6(1) may output the first corrected data CDATA<1> as the first write data WDATA<1> when the first write control signal WCNT<1> has a logic "low" level. The second data replacement circuit 6(2) may generate the second write data WDATA<2> from the second corrected data CDATA<2> and the second pad data PDATA<2> based on the second write control signal WCNT<2>. The second data replacement circuit 6(2) may output the second pad data PDATA<2> as the second write data WDATA<2> when the second write control signal WCNT<2> has a logic "high" level. The second data replacement circuit 6(2) may output the second corrected data CDATA<2> as the second write data WDATA<2> when the second write control signal WCNT<2> has a logic "low" level. The N$^{th}$ data replacement circuit 6(N) may generate the N$^{th}$ write data WDATA<N> from the N$^{th}$ corrected data CDATA<N> and the N$^{th}$ data PDATA<N> based on the N$^{th}$ write control signal WCNT<N>. The N$^{th}$ data replacement circuit 6(N) may output the N$^{th}$ pad data PDATA<N> as the N$^{th}$ write data WDATA<N> when the N$^{th}$ write control signal WCNT<N> has a logic "high" level. The N$^{th}$ data replacement circuit 6(N) may output the N$^{th}$ corrected data CDATA<N> as the N$^{th}$ write data WDATA<N> when the N$^{th}$ write control signal WCNT<N> has a logic "low" level.

The write operations performed in the core circuit 14 is described hereinafter in conjunction with a case that the error flag EFLAG is enabled, the first to third cases "CASE1", "CASE2" and "CASE3" illustrated in FIG. 10, and the fourth case "CASE4" illustrated in FIG. 12.

The write operation preformed in the core circuit 14 is described hereinafter with reference to FIG. 15 in conjunction with the case that the error flag EFLAG is enabled and the first case "CASE1" illustrated in FIG. 10.

When the error flag EFLAG is enabled to have a logic "high" level due to the first to N$^{th}$ read data RDATA<1:N> including an error, all of the first to eighth write control signals WCNT<1:8> may be generated to have a logic "high" level. In addition, in the first case "CASE1" that the first and second bit change signals XC<1:2> have a logic level combination of 'H,H' and the first and second burst change signals BC<1:2> have a logic level combination of 'H,H' while the error flag EFLAG is disabled to have a logic "low" level by the first to N$^{th}$ read data RDATA<1:N> without any error, all of the first to eighth write control signals WCNT<1:8> may be set to have a logic "high" level. Because a first driver 71 is activated by the first write control signal WCNT<1> which is set to have a logic "high" level, data DQ1 inputted through a first pad and data DQ2 inputted through a second pad may be stored into the first cell block CB1. Because a second driver 72 is activated by the second write control signal WCNT<2> which is set to have a logic "high" level, the data DQ1 inputted through the first pad and the data DQ2 inputted through the second pad may be stored into the second cell block CB2. Because a third driver 73 is activated by the third write control signal WCNT<3> which is set to have a logic "high" level, data DQ3 inputted through a third pad and data DQ4 inputted through a fourth pad may be stored into the first cell block CB1. Because a fourth driver 74 is activated by the fourth write control signal WCNT<4> which is set to have a logic "high" level, the data DQ3 inputted through the third pad and the data DQ4 inputted through the fourth pad may be stored into the second cell block CB2. Because a fifth driver 75 is activated by the fifth write control signal WCNT<5> which is set to have a logic "high" level, the data DQ1 inputted through the first pad and the data DQ2 inputted through the second pad may be stored into the third cell block CB3. Because a sixth driver 76 is activated by the sixth write control signal WCNT<6> which is set to have a logic "high" level, the data DQ1 inputted through the first pad and the data DQ2 inputted through the second pad may be stored into the fourth cell block CB4. Because a seventh driver 77 is activated by the seventh write control signal WCNT<7> which is set to have a logic "high" level, the data DQ3 inputted through the third pad and the data DQ4 inputted through the fourth pad may be stored into the third cell block CB3. Because an eighth driver 78 is activated by the eighth write control signal WCNT<8> which is set to have a logic "high" level, the data DQ3 inputted through the third pad and the data DQ4 inputted through the fourth pad may be stored into the fourth cell block CB4. In the first case "CASE1" while the error flag EFLAG is enabled to have a logic "high" level, the write operation of the core circuit 14 may be performed in a bit organization mode of "×4" with a burst length of "4". The bit organization mode of "×4" means a data input/output (I/O) mode that data are inputted or outputted through four pads. The first cell block CB1 may receive data corresponding to a first burst length BL1, and the second cell block CB2 may receive data corresponding to a second burst length BL2. In addition, the third cell block CB3 may receive data corresponding to a third burst length BL3, and the fourth cell block CB4 may receive data corresponding to a fourth burst length BL4. When the burst length is set to be "4", the data may be stored into the first to fourth cell blocks CB1~CB4.

Figure 16:
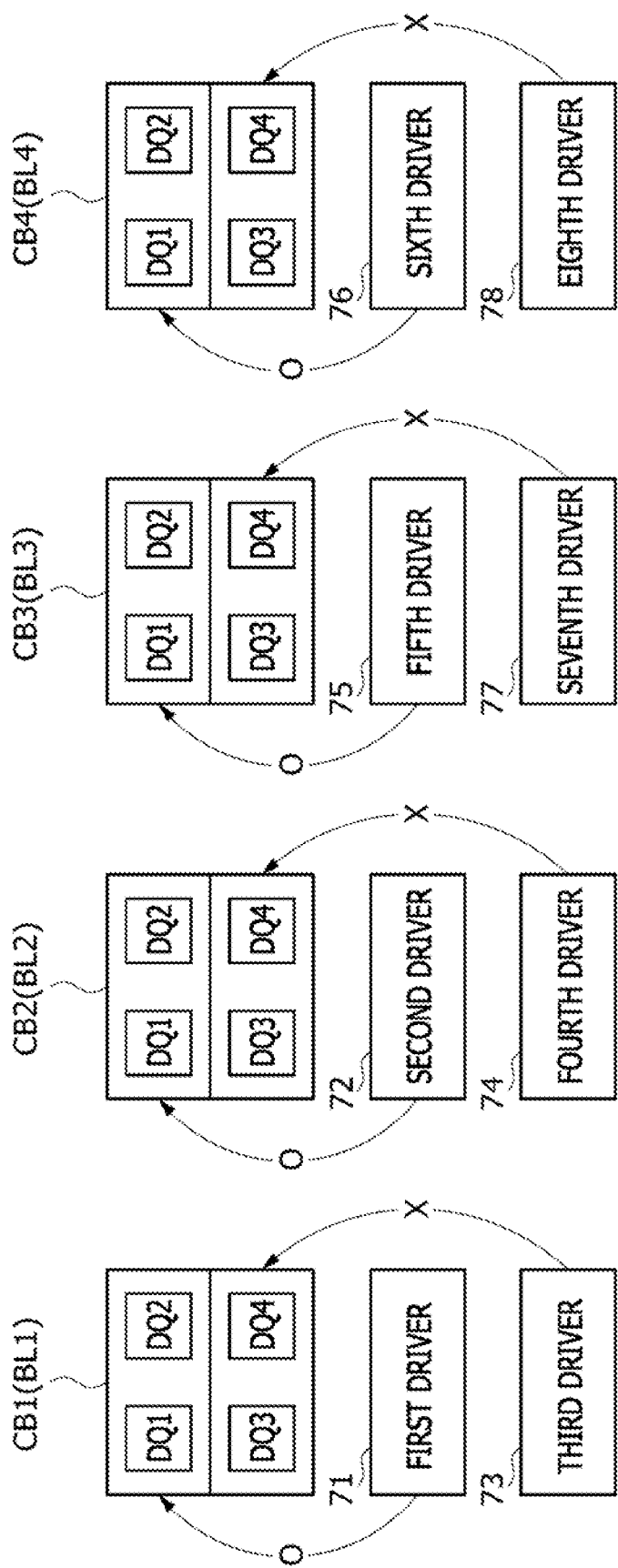

The write operation performed in the core circuit 14 is described hereinafter with reference to FIG. 16 in conjunction with the second case "CASE2" illustrated in FIG. 10.

In the second case "CASE2" that the first and second bit change signals XC<1:2> have a logic level combination of 'H,L' and the first and second burst change signals BC<1:2> have a logic level combination of 'H,L' while the error flag EFLAG is disabled to have a logic "low" level by the first to N$^{th}$ read data RDATA<1:N> without any error, all of the first and second write control signals WCNT<1:2> and the fifth and sixth write control signals WCNT<5:6> may be generated to have a logic "high" level and all of the third and fourth write control signals WCNT<3:4> and the seventh and eighth write control signals WCNT<7:8> may be generated to have a logic "low" level. Because the first driver 71 is activated by the first write control signal WCNT<1> which is set to have a logic "high" level, the data DQ1 inputted through the first pad and the data DQ2 inputted through the second pad may be stored into the first cell block CB1. Because the second driver 72 is activated by the second write control signal WCNT<2> which is set to have a logic "high" level, the data DQ1 inputted through the first pad and the data DQ2 inputted through the second pad may be stored into the second cell block CB2. Because the fifth driver 75 is activated by the fifth write control signal WCNT<5> which is set to have a logic "high" level, the data DQ1 inputted through the first pad and the data DQ2 inputted through the second pad may be stored into the third cell block CB3. Because the sixth driver 76 is activated by the sixth write control signal WCNT<6> which is set to have a logic "high" level, the data DQ1 inputted through the first pad and the data DQ2 inputted through the second pad may be stored into the fourth cell block CB4. In the second case "CASE2" illustrated in FIG. 10, the write operation of the core circuit 14 may be performed in the bit organization mode of "×2" with the burst length of "4". The bit organization mode of "×2" means a data input/output (I/O) mode that data are inputted or outputted through two pads.

Figure 17:
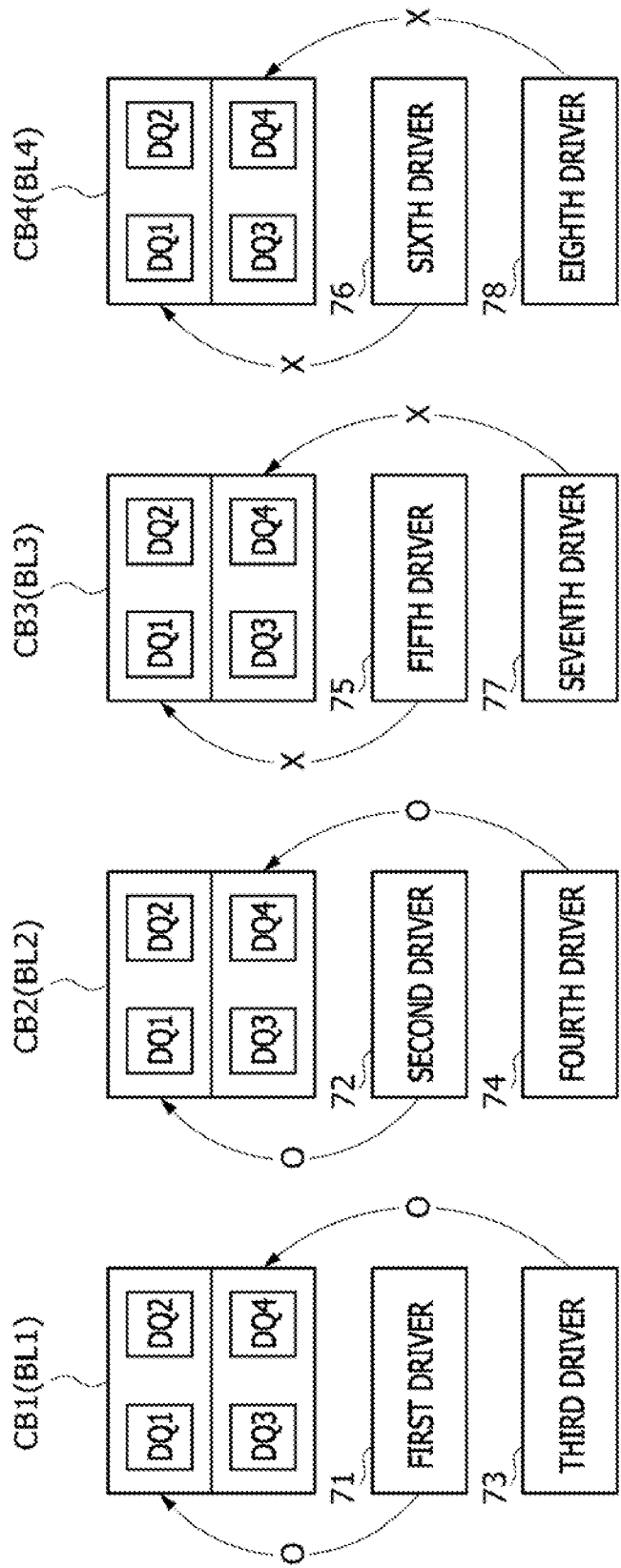

The write operation performed in the core circuit 14 is described hereinafter with reference to FIG. 17 in conjunction with the third case "CASE3" illustrated in FIG. 10.

In the third case "CASE3" that the first and second bit change signals XC<1:2> have a logic level combination of 'H,L' and the first and second burst change signals BC<1:2> have a logic level combination of 'H,L' while the error flag EFLAG is disabled to have a logic "low" level by the first to $N^{th}$ read data RDATA<1:N> without any error, all of the first to fourth write control signals WCNT<1:4> may be generated to have a logic "high" level and all of the fifth to eighth write control signals WCNT<5:8> may be generated to have a logic "low" level. Because the first driver 71 is activated by the first write control signal WCNT<1> which is set to have a logic "high" level, the data DQ1 inputted through the first pad and the data DQ2 inputted through the second pad may be stored into the first cell block CB1. Because the second driver 72 is activated by the second write control signal WCNT<2> which is set to have a logic "high" level, the data DQ1 inputted through the first pad and the data DQ2 inputted through the second pad may be stored into the second cell block CB2. Because the third driver 73 is activated by the third write control signal WCNT<3> which is set to have a logic "high" level, the data DQ3 inputted through the third pad and the data DQ4 inputted through the fourth pad may be stored into the first cell block CB1. Because the fourth driver 74 is activated by the fourth write control signal WCNT<4> which is set to have a logic "high" level, the data DQ3 inputted through the third pad and the data DQ4 inputted through the fourth pad may be stored into the second cell block CB2. In the third case "CASE3" illustrated in FIG. 10, the write operation of the core circuit 14 may be performed in the bit organization mode of "×4" with the burst length of "2". When the burst length is set to be "2", the data may be stored into the first and second cell blocks CB1 and CB2.

Figure 18:
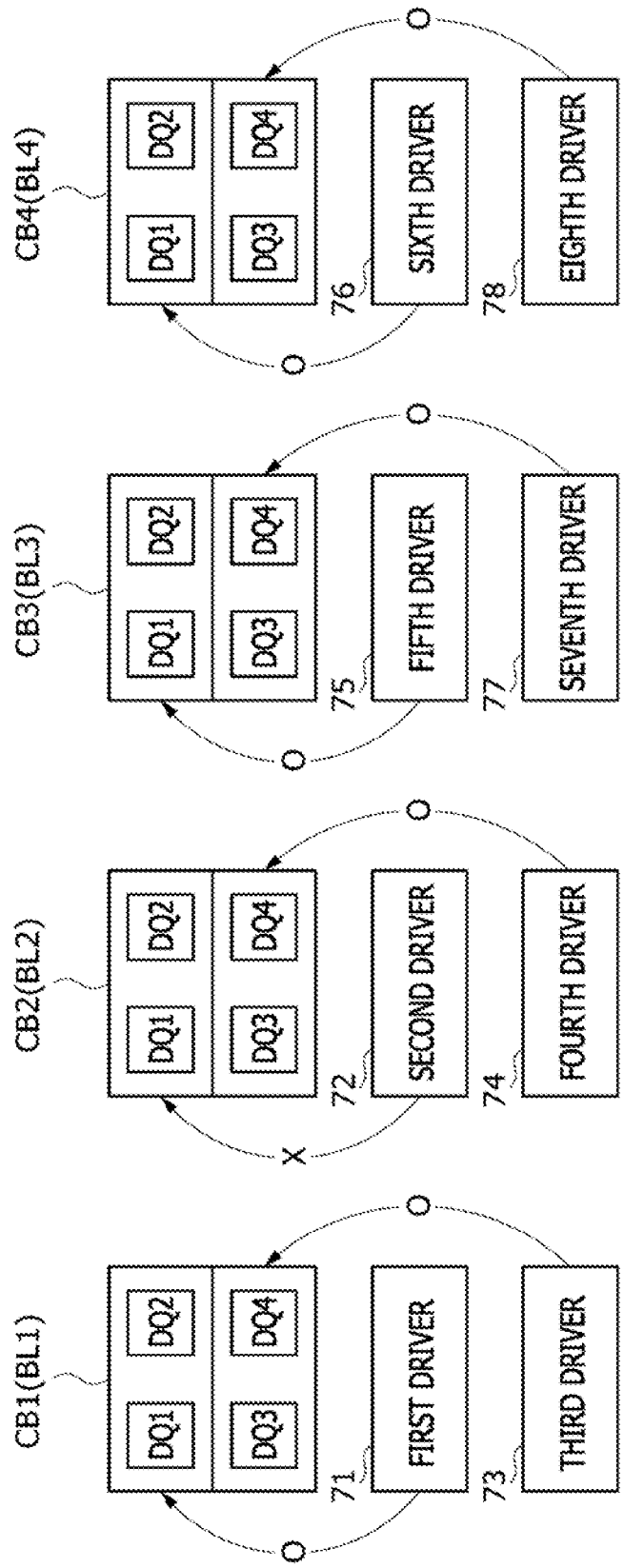

The write operation performed in the core circuit 14 is described hereinafter with reference to FIG. 18 in conjunction with the fourth case "CASE4" illustrated in FIG. 12.

In the fourth case "CASE4" that only the second data mask signal DM<2> among the first to eighth data mask signals DM<1:8> is set to have a logic "low" level while all of the first to eighth pre-decoded signals PDEC<1:8> are set to have a logic "high" level and the error flag EFLAG is disabled to have a logic "low" level by the first to $N^{th}$ read data RDATA<1:N> without any error, all of the first write control signal WCNT<1> and the third to eighth write control signals WCNT<3:8> may be set to have a logic "high" level and the second write control signal WCNT<2> may be set to have a logic "low" level. Because the first driver 71 is activated by the first write control signal WCNT<1> which is set to have a logic "high" level, the data DQ1 inputted through the first pad and the data DQ2 inputted through the second pad may be stored into the first cell block CB1. Because the third driver 73 is activated by the third write control signal WCNT<3> which is set to have a logic "high" level, the data DQ3 inputted through the third pad and the data DQ4 inputted through the fourth pad may be stored into the first cell block CB1. Because the fourth driver 74 is activated by the fourth write control signal WCNT<4> which is set to have a logic "high" level, the data DQ3 inputted through the third pad and the data DQ4 inputted through the fourth pad may be stored into the second cell block CB2. Because the fifth driver 75 is activated by the fifth write control signal WCNT<5> which is set to have a logic "high" level, the data DQ1 inputted through the first pad and the data DQ2 inputted through the second pad may be stored into the third cell block CB3. Because the sixth driver 76 is activated by the sixth write control signal WCNT<6> which is set to have a logic "high" level, the data DQ1 inputted through the first pad and the data DQ2 inputted through the second pad may be stored into the fourth cell block CB4. Because the seventh driver 77 is activated by the seventh write control signal WCNT<7> which is set to have a logic "high" level, the data DQ3 inputted through the third pad and the data DQ4 inputted through the fourth pad may be stored into the third cell block CB3. Because the eighth driver 78 is activated by the eighth write control signal WCNT<8> which is set to have a logic "high" level, the data DQ3 inputted through the third pad and the data DQ4 inputted through the fourth pad may be stored into the fourth cell block CB4. In the fourth case "CASE4" illustrated in FIG. 12, the write operation of the core circuit 14 may be performed in a way that the data are stored into the first to fourth cell blocks CB1~CB4 while only the second driver 72 is inactivated.

As described above, the semiconductor device 100 according to an embodiment may store the data DQ1 inputted through the first pad, the data DQ2 inputted through the second pad, the data DQ3 inputted through the third pad, and the data DQ4 inputted through the fourth pad into the first to fourth cell blocks CB1~CB4 when the error flag EFLAG is enabled to have a logic "high" level. The semiconductor device 100 may operate in the bit organization mode of "×2" with the burst length of "4" when the error flag EFLAG is enabled to have a logic "high" level. That is, the semiconductor device 100 may activate all of drivers included in the core circuit 14 to perform operations for storing all of write data generated according to a read-modify-write operation into the cell blocks. As a result, the reliability of a write operation may be improved.

Meanwhile, when the error flag EFLAG is disabled to have a logic "low" level, the semiconductor device 100 may determine the number of pads through which the data are inputted, a burst length, and pads blocking the input of the data according to a logic level combination of the bit change signals, the burst change signals, and the data mask signals, thereby activating only some of the drivers included in the core circuit 14 to perform the write operation included in the read-modify-write operation. As a result, it may be possible to reduce power consumption of the semiconductor device 100.

The read-modify-write operation performed in the semiconductor device 100 is described hereinafter with reference to FIGS. 19 and 20 in conjunction with a case that the error flag EFLAG is enabled to have a logic "high" level and a case that the error flag EFLAG is disabled to have a logic "low" level.

As illustrated in FIG. 19, when the read-modify-write operation is performed and an error is included in read data R1, R2, R3, and R4 outputted from the core circuit 14 after the read operation of the read-modify-write operation (see a block S71), the error may be corrected to generate corrected data R1, R2, C1, and R4 (see a block S72). Some of the corrected data R1, R2, C1, and R4 may be replaced with pad data P1 and P2 inputted through pads according to the number of pads receiving data and a burst length, thereby generating write data P1, P2, C1, and R4 (see a block S73). When the write operation for the write data P1, P2, C1, and R4 is performed, all of the write data P1, P2, C1, and R4 may be stored into the core circuit 14 because the read data R1, R2, R3, and R4 correspond to erroneous data including an error (see a block S74).

As illustrated in FIG. 20, when the read-modify-write operation is performed and no error is included in read data R5, R6, R7, and R8 outputted from the core circuit 14 after the read operation of the read-modify-write operation (see a block S81), the read data R5, R6, R7, and R8 may correspond to corrected data (see a block S82). Some of the corrected data R5, R6, R7, and R8 may be replaced with pad data P3 and P4 inputted through pads according to the number of pads receiving data and a burst length, thereby generating write data P3, P4, R7, and R8 (see a block S83). When the write operation for the write data P3, P4, R7, and R8 is performed, only the replaced data P3 and P4 of the write data P3, P4, R7, and R8 might be stored into the core circuit 14 because the read data R5, R6, R7, and R8 correspond to normal data without any error (see a block S84).

According to the embodiment described above, when no error is included in read data outputted by a read operation, a write operation for only data, which are replaced with pad data provided by an external device, among the read data may be performed to reduce power consumption during the write operation.

Moreover, according to the embodiment, when the read data outputted by the read operation are erroneous data including an error, the error may be corrected to generate corrected data and the write operation for the corrected data may be performed to improve the reliability of the write operation.

The semiconductor device 100 described with reference to FIG. 1 may be applied to an electronic system that includes a memory system, a graphic system, a computing system, a mobile system, or the like. For example, as illustrated in FIG. 21, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include the semiconductor device 100 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 21 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    an error correction circuit configured to generate corrected data and an error flag from read data according to whether an error is included in the read data outputted when a read operation is performed; and
    a write operation control circuit configured to generate a write control signal for controlling a write operation based on the error flag,
    wherein the write control signal is generated based on the number of pads receiving pad data and a burst length when no error is included in the read data.

2. The semiconductor device of claim 1, wherein the error correction circuit generates the error flag, wherein the error flag is enabled when an error is included in the read data.

3. The semiconductor device of claim 1, wherein the error correction circuit is configured to:
    correct the error included in the read data to generate the corrected data when the error flag is enabled; and
    output the read data as the corrected data when the error flag is disabled.

4. The semiconductor device of claim 1, wherein the error correction circuit comprises:
    an error flag generation circuit configured to generate the error flag based on a syndrome signal which is generated from the read data; and
    a corrected data generation circuit configured to generate the corrected data from the read data based on the syndrome signal.

5. The semiconductor device of claim 4, wherein the error flag generation circuit comprises:
a period signal generation circuit configured to generate a read period signal based on a read pulse and configured to generate a write period signal based on a write pulse; and
an error flag output circuit configured to output a pre-flag generated based on the syndrome signal as the error flag according to the read period signal and the write period signal.

6. The semiconductor device of claim 1, wherein the write operation control circuit is configured to generate the write control signal from a write strobe pulse based on the error flag, a bit change signal, a burst change signal, and a data mask signal.

7. The semiconductor device of claim 6,
wherein the bit change signal has a logic level combination for setting the number of the pads receiving the pad data during the write operation;
wherein the burst change signal has a logic level combination for setting the burst length during the write operation; and
wherein the data mask signal has a logic level combination for selecting pads that block input of data during the write operation.

8. The semiconductor device of claim 6, wherein the write strobe pulse is generated from a write pulse, wherein the write pulse is generated based on a control command for a read-modify-write operation.

9. The semiconductor device of claim 6, wherein the write operation control circuit comprises a column decoding circuit configured to generate a pre-decoded signal from the write strobe pulse based on the error flag, the bit change signal, and the burst change signal.

10. The semiconductor device of claim 9,
wherein the write strobe pulse comprises a plurality of write strobe pulses;
wherein the pre-decoded signal comprises a plurality of pre-decoded signals; and
wherein the column decoding circuit is configured to generate the plurality of pre-decoded signals from the plurality of write strobe pulses when the error flag is enabled and is configured to generate any one of the plurality of pre-decoded signals from any one write strobe pulse selected from the plurality of write strobe pulses according to the bit change signal and the burst change signal when the error flag is disabled.

11. The semiconductor device of claim 9, wherein the write operation control circuit further comprises a mask control circuit configured to generate a decoded signal from the pre-decoded signal based on the error flag and the data mask signal.

12. The semiconductor device of claim 11,
wherein the pre-decoded signal comprises a plurality of pre-decoded signals;
wherein the decoded signal comprises a plurality of decoded signals; and
wherein the mask control circuit is configured to generate the plurality of decoded signals from the plurality of pre-decoded signals when the error flag is enabled and is configured to generate any one of the decoded signals from any one pre-decoded signal selected from the plurality of pre-decoded signals according to the data mask signal when the error flag is disabled.

13. The semiconductor device of claim 11, wherein the write operation control circuit further comprises a write control signal generation circuit configured to generate the write control signal from the decoded signal during a time period when the write operation is performed.

14. The semiconductor device of claim 1, further comprising a write data generation circuit configured to generate write data by replacing the corrected data with the pad data based on the write control signal.

\* \* \* \* \*